(12) United States Patent
Tan et al.

(10) Patent No.: US 9,907,197 B2
(45) Date of Patent: Feb. 27, 2018

(54) ELECTRONIC CARD CONNECTION DEVICE AND ELECTRONIC DEVICE

(71) Applicant: Molex, LLC, Lisle, IL (US)

(72) Inventors: Han Guan Tan, Singapore (SG); Kian Heng Lim, Singapore (SG)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/238,295

(22) Filed: Aug. 16, 2016

(65) Prior Publication Data

US 2016/0360631 A1 Dec. 8, 2016

Related U.S. Application Data

(62) Division of application No. 14/334,086, filed on Jul. 17, 2014, now Pat. No. 9,445,521.

(30) Foreign Application Priority Data

Jul. 18, 2013 (CN) .......................... 2013 1 0303395

(51) Int. Cl.
H05K 7/00 (2006.01)
H05K 5/02 (2006.01)
H01R 13/46 (2006.01)
H01R 13/70 (2006.01)
H05K 7/14 (2006.01)
G06K 7/00 (2006.01)
G06K 13/08 (2006.01)
(Continued)

(52) U.S. Cl.
CPC ......... *H05K 5/0286* (2013.01); *G06K 7/0021* (2013.01); *G06K 13/08* (2013.01); *G06K 13/0831* (2013.01); *H01R 13/46* (2013.01); *H01R 13/701* (2013.01); *H04B 1/3816* (2013.01); *H04B 1/3818* (2015.01); *H04M 1/026* (2013.01); *H05K 7/1427* (2013.01)

(58) Field of Classification Search
CPC .. H05K 5/0286; H05K 7/1427; H04B 1/3818; H04B 1/3816; H04M 1/026; H01R 13/701; H01R 13/46; G06K 7/0021; G06K 13/0831
USPC .................................. 361/728–730
See application file for complete search history.

(56) References Cited

U.S. PATENT DOCUMENTS 6,050,492 A 4/2000 Hoolhorst
6,717,805 B2 4/2004 Liu et al.
(Continued)

FOREIGN PATENT DOCUMENTS

CN 202178465 U 3/2012

*Primary Examiner* — Hung S Bui
(74) *Attorney, Agent, or Firm* — Clarence R. Moon

(57) ABSTRACT

The present disclosure relates to an electronic card connection device and an electronic device. The electronic card connection device comprises a connector, an electronic card tray and a switch. The connector comprises a terminal housing and a shell, the shell and the terminal housing define a mating space. The electronic card tray being inserted in the mating space, the electronic card tray may comprise an electronic card receiving recess, a mounting block positioned in front of the electronic card receiving recess and an operating handle pivotally connected to the mounting block. The switch may be positioned alongside a rotation range of the operating handle, and partially protrudes into the rotation range allowing rotation of the operating handle to switch the state of the switch.

5 Claims, 31 Drawing Sheets

(51) Int. Cl.
*H04B 1/3816* (2015.01)
*H04M 1/02* (2006.01)
*H04B 1/3818* (2015.01)

(56) References Cited

U.S. PATENT DOCUMENTS

| | | |
|---|---|---|
| 7,303,413 B1 | 12/2007 | Lai et al. |
| 8,292,642 B1 | 10/2012 | Lee et al. |
| 8,308,514 B1 | 11/2012 | Su et al. |
| 8,376,764 B1 | 2/2013 | Hundertmark |
| 9,048,594 B2 * | 6/2015 | Lim ................ H01R 27/00 |
| 9,106,310 B2 | 8/2015 | Dondzik et al. |
| 2003/0195020 A1 | 10/2003 | Kubo |
| 2009/0267677 A1 | 10/2009 | Myers et al. |
| 2013/0267106 A1 * | 10/2013 | Jenks ................ G11B 17/00 |
| | | 439/160 |
| 2013/0314854 A1 * | 11/2013 | Chung ............. H05K 5/0239 |
| | | 361/679.01 |
| 2014/0315404 A1 | 10/2014 | Wang et al. |

* cited by examiner

ELECTRONIC CARD CONNECTION DEVICE AND ELECTRONIC DEVICE

RELATED APPLICATIONS

This application is a divisional application of U.S. application Ser. No. 14/334,086, filed Jul. 17, 2014, now U.S. Pat. No. 9,445,521, which is incorporated herein by reference in its entirety and claims priority to Chinese Application No. 201310303395.8, filed Jul. 18, 2013, which is incorporated herein by reference in its entirety.

TECHNICAL FIELD

The present disclosure relates to an electronic card connection device and an electronic device.

BACKGROUND ART

A SIM (Subscriber Identity Module) card is common in a mobile device, and is usually mounted on the mobile device via an electronic card connector.

The electronic card connectors use a tray to load the SIM card. In order to protect the electronic card and ensure data transmission integrity, a detection switch is provided inside the connector. During the process of inserting and pulling the tray, the mobile device uses the detection switch to detect the position of the electronic card, and activate the switch allowing power and data transmission.

Typically, when the tray is inserted, the detection switch will switch the power off before a contact pad of the electronic card contacts a terminal of the connector, and then the detection switch will switch the power on after the contact pad of the electronic card contacts the terminal of the connector. When the tray is pulled out, the detection switch will switch the power off when the contact pad of the electronic card contacts the terminal of the connector, the detection switch then switch the power on after the contact pad of the electronic card is separated from the terminal of the connector.

The detection switch is actuated during movement of the tray and if the detection switch is inappropriately actuated during movement of the tray or the detection switch cannot be actuated timely due to too quick inserting and pulling of the tray, the terminal supplying the power or performing data transmission at the moment the electronic card and the terminal contact, thereby causing damage to the data of the mobile device, even damage to the circuit of the electronic card or the mobile device. In addition, the detection switch may be actuated during movement of the tray, so that power supply and data transmission are started when the electronic card and the terminal are not yet fully in contact, thereby causing damage to the data or the circuit of the electronic card or the mobile device.

SUMMARY OF THE INVENTION

In view of the above problems, the present disclosure correspondingly provides an electronic card connection device and an electronic device.

An embodiment of the present disclosure discloses an electronic card connection device. The electronic card connection device comprises a connector, an electronic card tray and a switch. The connector comprises a terminal housing and a shell, the shell and the terminal housing define a mating space. The electronic card tray is capable of being inserted in the mating space, the electronic card tray may comprise an electronic card receiving recess, a mounting block positioned in front of the electronic card receiving recess and an operating handle pivotally connected to the mounting block. The switch can be positioned alongside a rotation range of the operating handle, and partially protruding into the rotation range, so as to allow the rotation of the operating handle to switch the state of the switch.

In an embodiment, the operating handle of the electronic card tray comprises a switch actuating member, the switch actuating member is used for pressing the switch.

In an embodiment, the electronic card tray comprises a first electronic card receiving recess and a second electronic card receiving recess respectively positioned at opposite sides of the electronic card tray, the operating handle comprises two switch actuating members provided in up-down or vertical direction.

In an embodiment, the operating handle of the electronic card tray comprises a pivoting portion, a locking portion and a push portion, the operating handle can be pivotally connected to the mounting block via the pivoting portion, the push portion can be used for rotating the operating handle, the locking portion is used for locking the operating handle on the mounting block, the locking portion and the push portion can be respectively positioned on opposite sides of the pivoting portion.

In an embodiment, the electronic card tray comprises a recessed portion and a resilient protruding portion, one of the recessed portion and the resilient protruding portion is the locking portion, the other one of the recessed portion and the resilient protruding portion is provided on the mounting block, the operating handle is locked by the resilient protruding portion engaging the recessed portion.

In an embodiment, the pivoting portion of the electronic card tray comprises a shaft portion and an engaging portion connected to the shaft portion, the engaging portion allows the operating handle to engage the mounting block.

In an embodiment, the electronic card tray comprises a retaining piece, the retaining piece presses the engaging portion of the pivoting portion.

In an embodiment, the electronic card tray comprises an insulative frame body and a metal bottom plate integrally injection molded with the insulative frame body.

In an embodiment, the insulative frame body of the electronic card tray comprises a peripheral wall, the electronic card receiving recess is defined by the metal bottom plate and the peripheral wall, a part of the insulative frame body is positioned in front of the electronic card receiving recess constituting the mounting block.

In an embodiment, the metal bottom plate of the electronic card tray comprises a pivot hole and the resilient protruding portion, the pivoting portion of the electronic card tray is pivotally connected to the pivot hole.

In an embodiment, the metal bottom plate of the electronic card tray comprises a protruding block, the protruding block protrudes out from a corresponding side wall surface of the insulative frame body, the protruding block can be used for retaining the electronic card tray in the connector.

In an embodiment, the connector comprises a latching portion, the protruding block of the electronic card tray and the latching portion can be engaged with each other to retain the inserted electronic card tray.

In an embodiment, each side edge of the terminal housing comprises a first latch portion and a first limiting portion, each side edge of the shell of the connector comprises a second latch portion and a second limiting portion, the first latch portion and the corresponding second latch portion are engaged with each other and in clearance fit, the first limiting portion and the corresponding second limiting portion are engaged with each other and in clearance fit.

In an embodiment, the shell of the connector comprises a support element used for supporting the electronic card tray with the support element partially extends obliquely upward along a mating direction of the electronic card tray.

In some embodiments, the switch comprises a movable member, a fixed member and an insulative body, the movable member comprises a clamp portion, the fixed member is partially embedded in the insulative body, the insulative body is clamped on the clamp portion and electrically isolates the movable member and the fixed member.

In some embodiments, the switch comprises a movable member, a fixed member and an insulative body, the fixed member comprises a clamp portion, the movable member is partially embedded in the insulative body, the insulative body is clamped on the clamp portion and electrically isolates the movable member and the fixed member.

In some embodiments, the electronic card connection device includes two switches, the two switches comprise two movable members, a fixed member and an insulative body, the fixed member comprises a clamp portion, the two movable members are partially embedded in the insulative body, the insulative body is clamped on the clamp portion and electrically isolates the two movable members and the fixed member, one of the two switches is positioned in front of the connector, and the other one of the two switches is positioned in front of and alongside the connector.

An electronic device of an embodiment of the present disclosure comprises a casing having an opening, a circuit board and an electronic card connection device of any one of the above embodiments, the connector and the switch are provided on the circuit board, the electronic card tray is inserted into the connector via the opening of the casing.

In some of the embodiments of the present disclosure, the switch of the electronic card connection device is actuated using the operating portion and is not actuated using the moving electronic card tray to ensure switching integrity of the power or signal and avoid damage to the electronic device, the electronic card or the stored data caused by inappropriate switching of the switch.

DETAILED DESCRIPTION OF THE PREFERRED EMBODIMENTS

In some embodiments, an electronic card connection device is mounted on an electronic device, and the electronic card connection device comprises a connector, an electronic card tray and a switch. Only in the case that a contact pad of the electronic card on the electronic card tray is securely in contact with a corresponding terminal of the connector is ensured, the switch is actuated, therefore, the use security of the electronic device can be ensured, and the data of the electronic device or the electronic card can be protected. In some embodiments, after the electronic card tray is fully inserted, then the switch is actuated, to avoid damage of the electronic device, the electronic card or the stored data. In some embodiments, the switch is actuated under the circumstance that the electronic card tray contacts the terminal and does not move.

Figure 1:
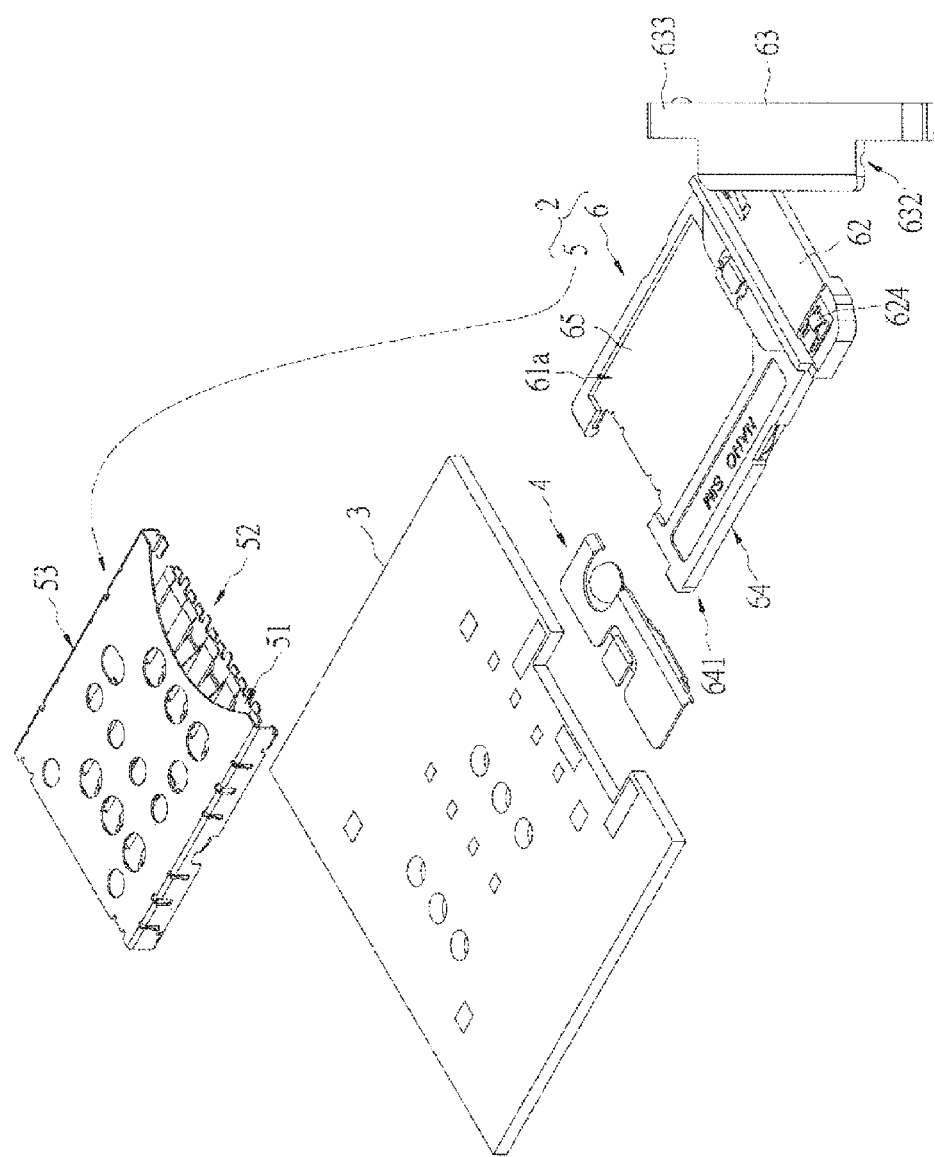
FIG. 1 is a schematic diagram of an embodiment of the present disclosure illustrating an electronic card connection device.
Figure 2:
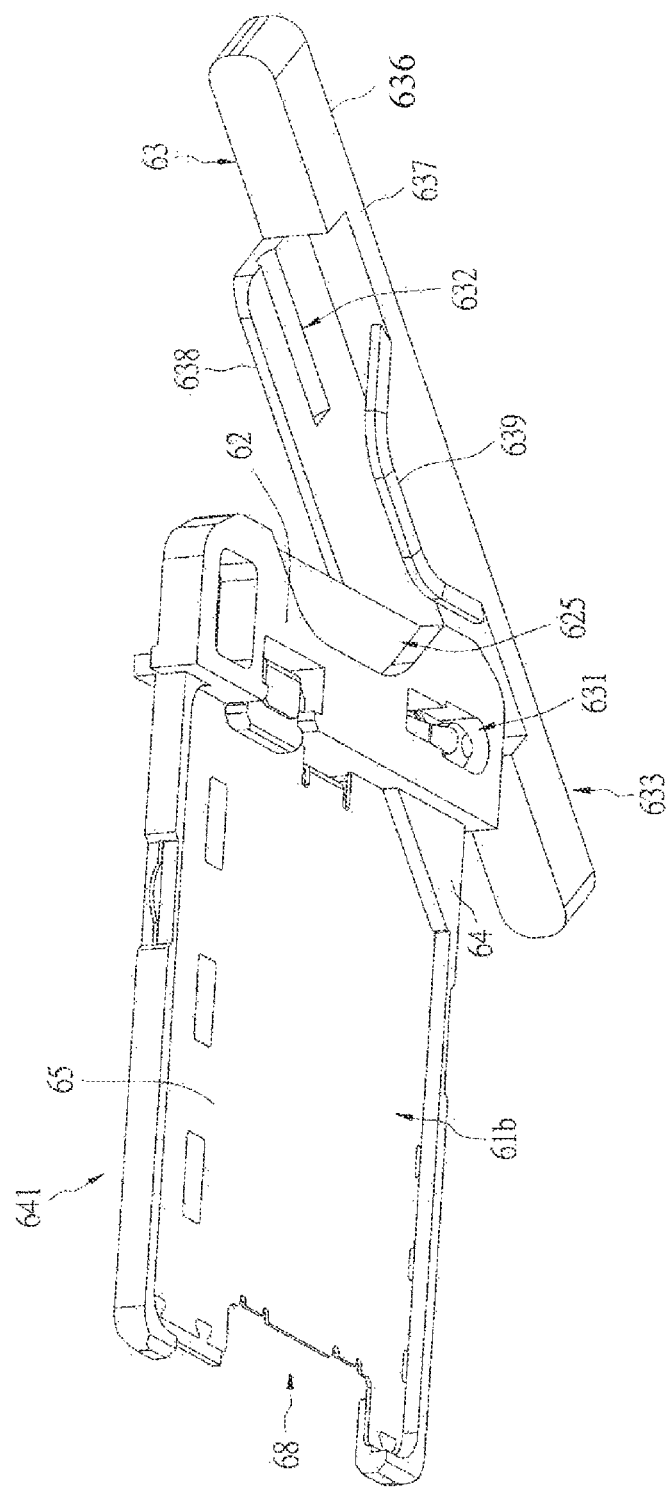
FIG. 2 is a schematic diagram of an embodiment of the present disclosure illustrating an electronic card tray.
Figure 3:
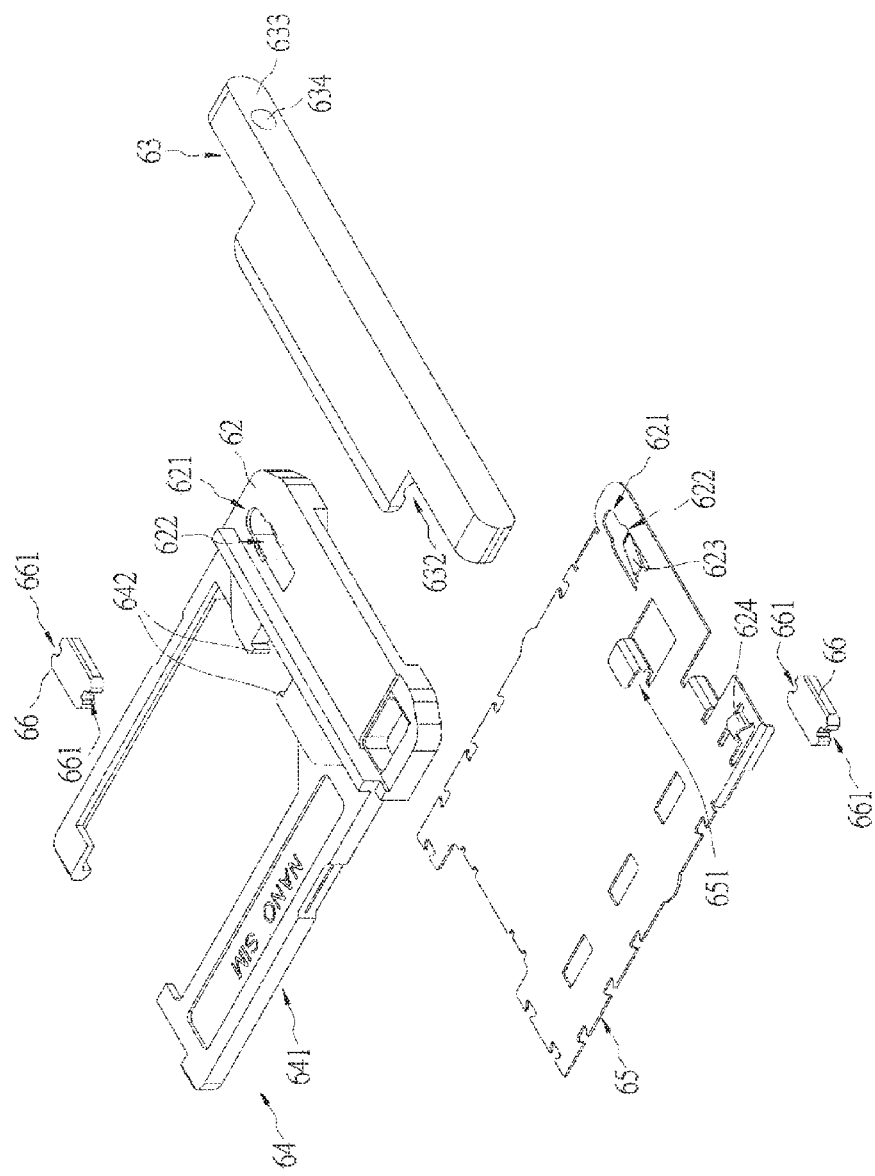
FIG. 3 is an exploded view of an embodiment of the present disclosure illustrating an electronic card tray.

FIG. 1 is a schematic diagram of an embodiment of the present disclosure illustrating an electronic card connection device 2. FIG. 2 is a schematic diagram of an embodiment of the present disclosure illustrating an electronic card tray 6. FIG. 3 is an exploded view of an embodiment of the present disclosure illustrating an electronic card tray 6. Referring to FIG. 1, the electronic card connection device 2 comprises a switch 4, a connector 5 and an electronic card tray 6. The electronic card tray 6 may be mated with the connector 5. A part of the electronic card tray 6 can move after the electronic card tray 6 is inserted into the connector 5 to switch the switch 4, and to control power supply and signal transmission of the connector 5.

Referring to FIG. 1, the connector 5 may be provided on a circuit board 3, and comprises a terminal housing 52 and a shell 53. The terminal housing 52 and the shell 53 may define a mating space 51. The electronic card tray 6 may be inserted into the mating space 51 of the connector 5.

Figure 13A:
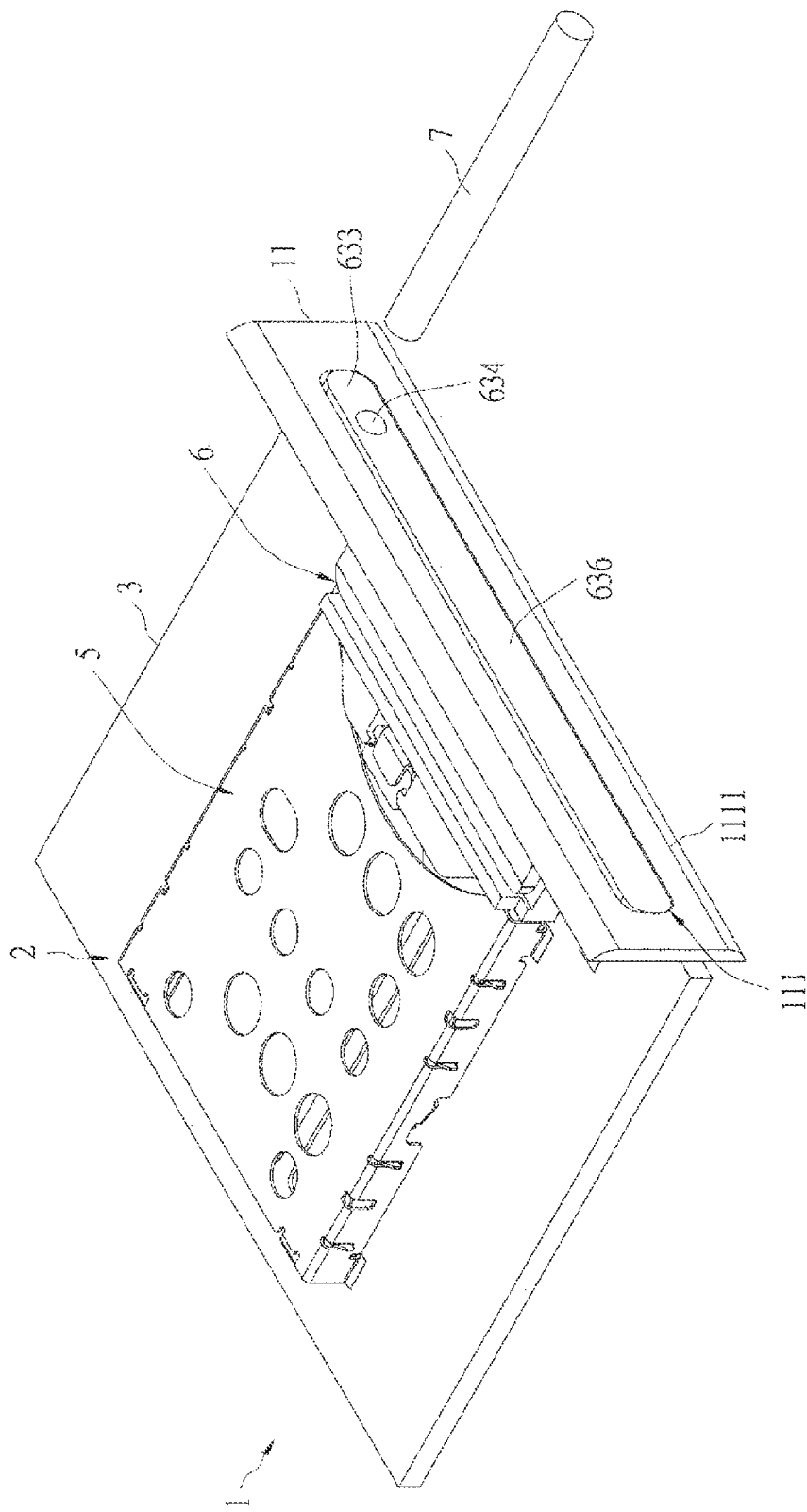
FIGS. 13A-13E are schematic diagrams of the present disclosure, illustrating steps that the electronic card tray is ejected from the connector.
Figure 13B:
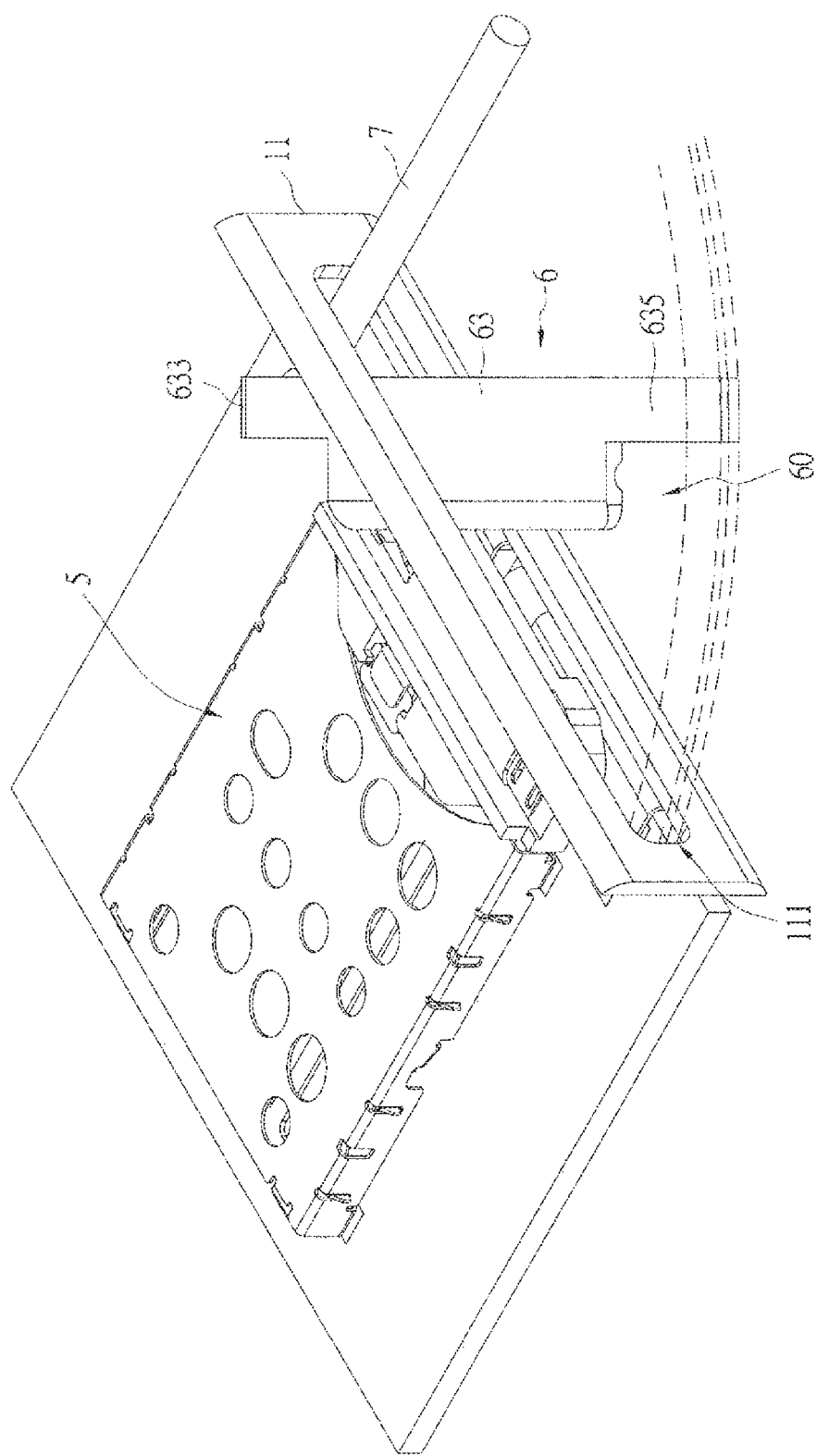

Referring to FIG. 1, FIG. 2 and FIG. 13B, the electronic card tray 6 may have an electronic card receiving recess 61a or 61b, a mounting block 62 and an operating handle 63. The electronic card receiving recess 61a or 61b may receive an electronic card (such as but not limited to the SIM card). The mounting block 62 may be positioned in front of the electronic card receiving recess 61a or 61b. The operating handle 63 may be pivotally connected to the mounting block 62, and may rotate to form a rotation range 60, as shown in FIG. 13B.

Referring to FIG. 1 and FIG. 13B, the switch 4 may be provided alongside the rotation range 60 of the operating handle 63, and partially protrudes into the rotation range 60, allowing rotation of the operating handle 63 and switch the state of the switch 4 (from on to off or from off to on).

Referring to FIGS. 1-3, the electronic card tray 6 has a space for inserting an electronic card. The electronic card tray 6 defines an electronic card receiving recess 61a or 61b. In an embodiment, the electronic card tray 6 comprises a first electronic card receiving recess 61a and a second electronic card receiving recess 61b, and the first electronic card receiving recess 61a and the second electronic card receiving recess 61b are provided at opposite sides of the electronic card tray 6, so the electronic card tray 6 can rotate reversibly on either side of the electronic card tray. The electronic card is inserted face down in either the first electronic card receiving recess 61a or the second electronic card receiving recess 61b and inserted into connector 5. In an embodiment, the first electronic card receiving recess 61a and the second electronic card receiving recess 61b is used for receiving different electronic cards; but the present disclosure is not limited to this. In the present embodiment, the first electronic card receiving recess 61a and the second electronic card receiving recess 61b may receive a nano SIM card and a micro SIM card, respectively.

Referring to FIGS. 1-3, the operating handle 63 may be used to assist inserting and withdrawing the electronic card tray 6. In an embodiment, one part of the operating handle 63 constitutes a front end portion of the electronic card tray 6, and the other part of the operating handle 63 and the mounting block 62 may overlap in an up and down direction when the operating handle 63 is engaged with the mounting block 62.

In an embodiment, the mounting block 62 defines a front side of the electronic card receiving recess 61a or 61b, therefore, the mounting block 62 can stop the electronic card from falling forward after the electronic card is mounted on the electronic card receiving recess 61a or 61b.

Figure 4:
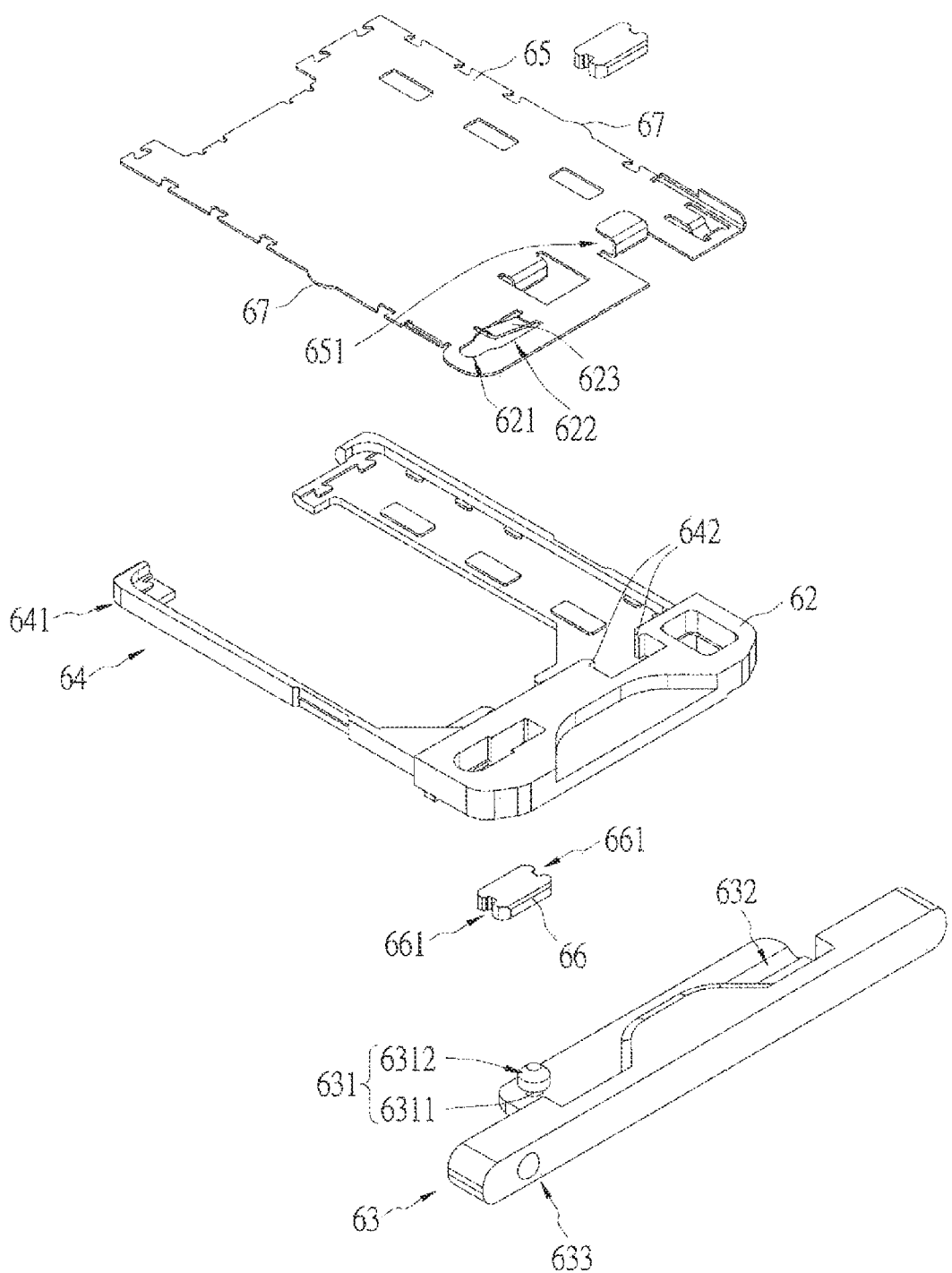
FIG. 4 is another exploded view of an embodiment of the present disclosure illustrating an electronic card tray.

FIG. 4 is another exploded view of an embodiment of the present disclosure illustrating an electronic card tray 6. Referring to FIGS. 1-4, the operating handle 63 may comprise a pivoting portion 631, a locking portion 632 and a push portion 633, the locking portion 632 and the push portion 633 may be respectively positioned on opposite sides of the pivoting portion 631. The operating handle 63 is pivotally connected to the mounting block 62 by the pivoting portion 631. The push portion 633 is pushed allowing the operating handle 63 to rotate around the pivoting portion 631. The locking portion 632 is used for locking the operating handle 63 on the mounting block 62.

Referring to FIG. 3, the push portion 633 of the operating handle 63 may comprise a marking 634. The marking 634 is used for indicating a pressed position on the operating handle 63. In an embodiment, the marking 634 comprises a recessed portion. In an embodiment, the marking 634 comprises a protrusion.

In an embodiment, the pivoting portion 631 protrudes from the operating handle 63 in part as a pivot. In another embodiment, the pivoting portion 631 may be a pivot hole.

Referring to FIG. 3 and FIG. 4, the mounting block 62 may comprise a pivot hole 621, the pivoting portion 631 of the operating handle 63 is pivotally connected to the pivot hole 621.

In an embodiment, as shown in FIG. 4, the pivoting portion 631 of the operating handle 63 comprises a shaft portion 6311 and an engaging portion 6312 connected to the shaft portion 6311. The shaft portion 6311 may pass through the pivot hole 621, and rotate in the pivot hole 621. The engaging portion 6312 can allow the operating handle 63 to engage on the mounting block 62 after the shaft portion 6311 is mounted on the pivot hole 621, so that the operating handle 63 cannot be easily disengaged from the mounting block 62. In an embodiment, only part of the cross-sectional dimension of the engaging portion 6312 is greater than the pivot hole 621. In an embodiment, the engaging portion 6312 is greater than the pivot hole 621.

Referring to FIG. 3 and FIG. 4, in an embodiment, the mounting block 62 may comprise a mounting hole 622. The mounting hole 622 is connected to the pivot hole 621 and is greater than the pivot hole 621. The mounting hole 622 may allow the engaging portion 6312 of the pivoting portion 631 to pass through and mount to the shaft portion 6311 in the pivot hole 621. Because the engaging portion 6312 is greater than the pivot hole 621, the operating handle 63 does not disengage from the mounting block 62.

Figure 5A:
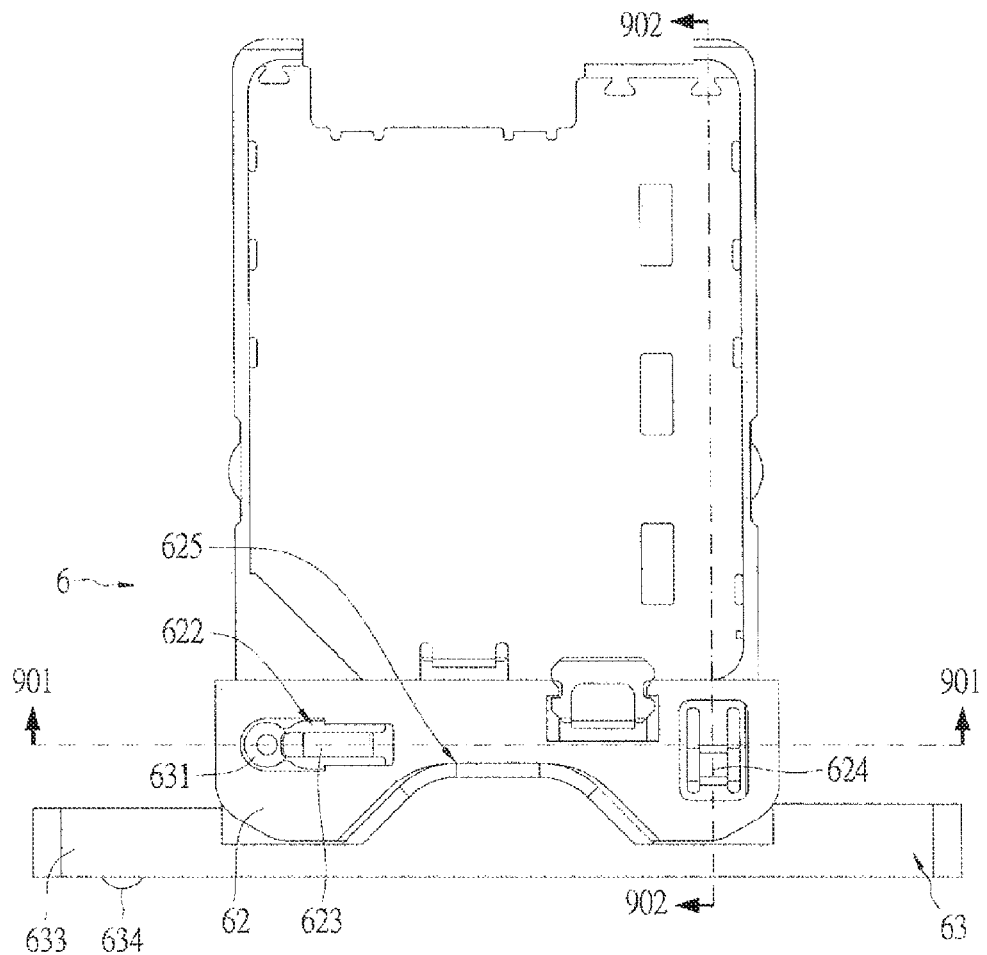
FIG. 5A is a schematic diagram of an embodiment of the present disclosure illustrating an electronic card tray.
Figure 5B:
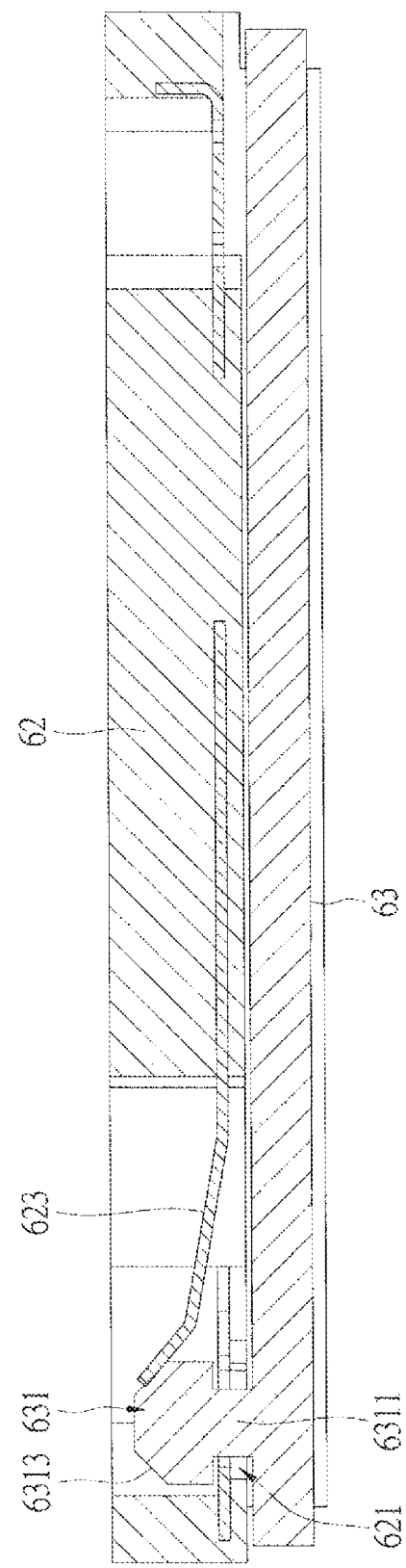
FIG. 5B is a cross-sectional view taken along a line 901-901 of FIG. 5A.
Figure 5C:
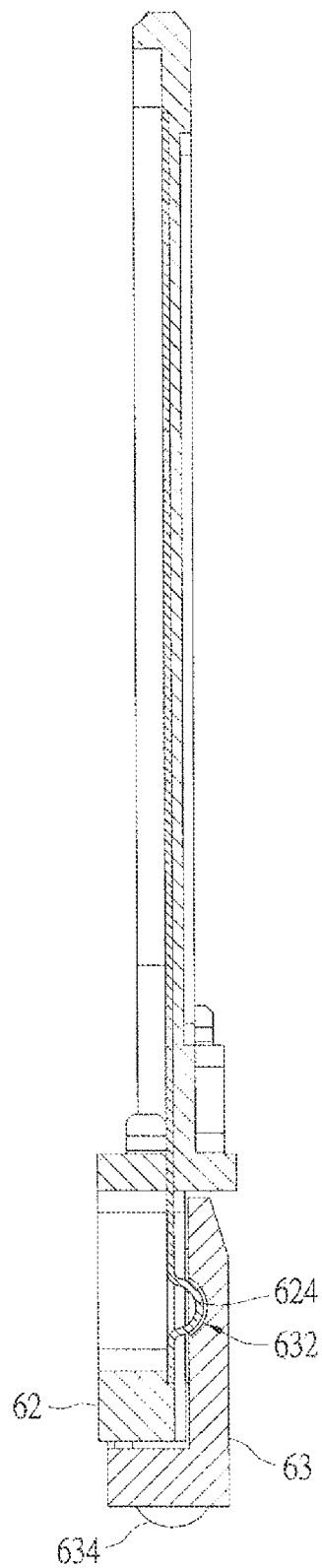
FIG. 5C is across-sectional view taken along a line 902-902 of FIG. 5A.

FIG. 5A is a schematic diagram of an embodiment of the present disclosure, illustrating an electronic card tray 6. FIG. 5B is a cross-sectional view taken along a line 901-901 of FIG. 5A. FIG. 5C is a cross-sectional view taken along a line 902-902 of FIG. 5A. Referring to FIG. 5A and FIG. 5B, the electronic card tray 6 or the mounting block 62 may comprise a retaining piece 623. After the shaft portion 6311 of the pivoting portion 631 of the operating handle 63 is mounted in the pivot hole 621, the retaining piece 623 will press the engaging portion 6312 to avoid the pivoting portion 631 from moving back to the mounting hole 622. In an embodiment, the retaining piece 623 is made of metal, but the present disclosure is not limited to this.

Referring to FIG. 5A and FIG. 5B, in an embodiment, the pivoting portion 631 may comprise an inclined surface 6313, the retaining piece 623 is pressed on the inclined surface 6313, to allow the pivoting portion 631 of the operating handle 63 to be maintained in the pivot hole 621.

Referring to FIG. 1 and FIG. 5C, the locking portion 632 retains the operating handle 63 on the mounting block 62, so the operating handle 63 cannot move freely away from the mounting block 62. In an embodiment, the locking portion 632 comprises a recessed portion, the mounting block 62 comprises a resilient protruding portion 624, and the operating handle 63 retains the operating handle 63 by the resilient protruding portion 624 engaging the locking portion 632 (or the recessed portion). After the electronic card tray 6 is completely assembled to the connector 5, the resilient protruding portion 624 is engaged with the locking portion 632, so the operating handle 63 cannot move freely; but the present disclosure is not limited to this. In an embodiment, the locking portion 632 comprises a protrusion, and the mounting block 62 is provided with a corresponding recessed portion. In an embodiment, the resilient protruding portion 624 is formed on a metal piece, but the present disclosure is not limited to this. In an embodiment, both ends of the metal piece are fixed. In an embodiment, one end of the metal piece is a free end.

Figure 6:
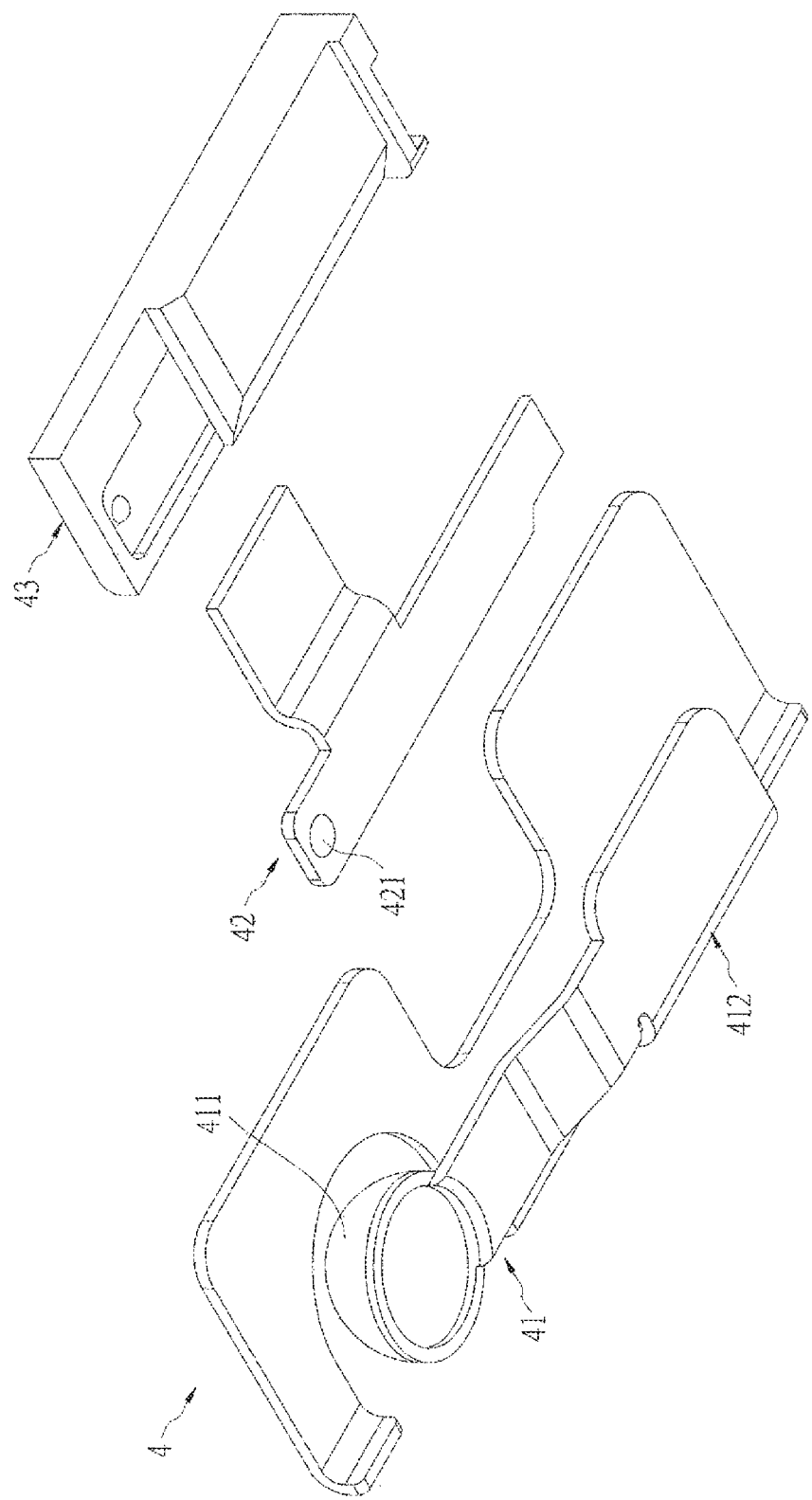
FIG. 6 is a schematic diagram of an embodiment of the present disclosure illustrating a switch.

FIG. 6 is a schematic diagram of an embodiment of the present disclosure illustrating a switch 4. Referring to FIG. 1 and FIG. 2, the switch 4 may be provided on the circuit board 3. The switch 4 may comprise a movable member 41, a fixed member 42 and an insulative body 43. The switch 4 can be actuated; that is the movable member 41 can be moved to contact the fixed member 42, or the movable member 41 can be moved away from the fixed member 42. The insulative body 43 is used for electrically isolating the movable member 41 and the fixed member 42.

In an embodiment, a combination of the movable member 41, the fixed member 42 and the insulative body 43 may be integrally injection molded, and may be electrically connected to the circuit board 3, but the present disclosure is not limited to this. In an embodiment, the movable member 41 may comprise a clamp portion 412, and the insulative body 43 may be clamped on the clamp portion 412. In an embodiment, the fixed member 42 may be partially embedded in the insulative body 43.

In an embodiment, the fixed member 42 comprises a contact point 421. After a combination of the fixed member 42 and the insulative body 43, and the movable member 41 are assembled together, the movable member 41 may contact the contact point 421; but the present disclosure is not limited to this.

In an embodiment, the switch 4 is normally closed. In an embodiment, the switch 4 is normally open.

In an embodiment, the switch 4 is separated from the connector 5. In an embodiment, the switch 4 is integrated with the connector 5, so mounting of the switch 4 and the connector 5 is more convenient, and relative position of the switch 4 and the connector 5 may be more accurate.

Figure 7A:
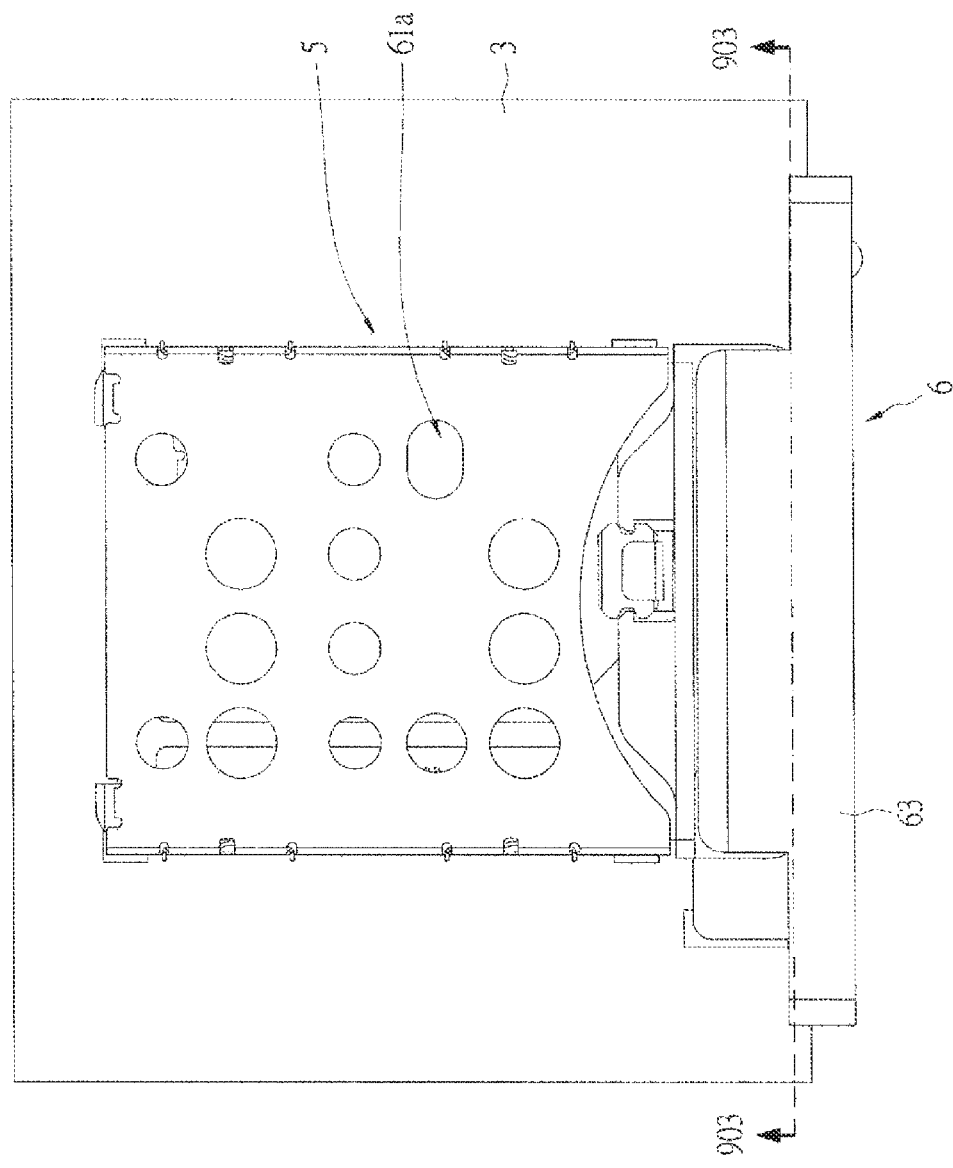
FIG. 7A is a schematic diagram of an embodiment of the present disclosure illustrating a electronic card connection device.
Figure 7B:
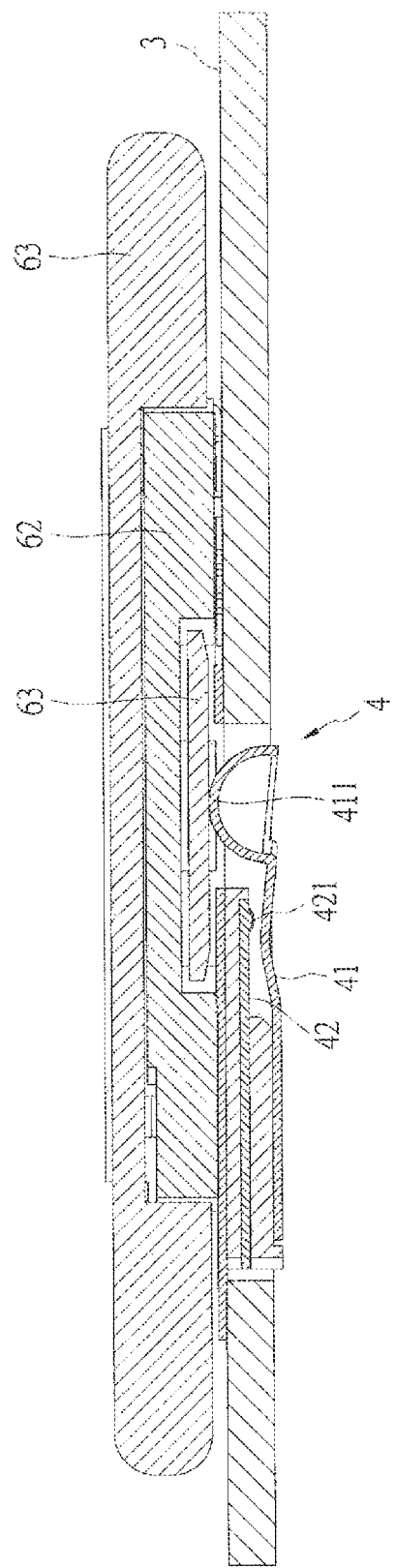
FIG. 7B is a cross-sectional view taken along a line 903-903 of FIG. 7A.

Referring to FIG. 7A and FIG. 7B, in an embodiment, the movable member 41 comprises a press portion 411. After the switch 4 is mounted, the press portion 411 may partially protrude out from the circuit board 3. The press portion 411 may partially protrude into the rotation range 60 allowing the operating handle 63 to press the press portion 411. When the electronic card tray 6 is inserted into the connector 5, and the operating handle 63 is not in contact with the press portion 411, the press portion 411 is not pressed, at this time the switch 4 is maintained in a normal state (a normally closed state or a normally open state, and the normally closed state is in the present embodiment). After the operating handle 63 is engaged with the mounting block 62, the press portion 411 is pressed, at this time the switch 4 is actuated.

Figure 7C:
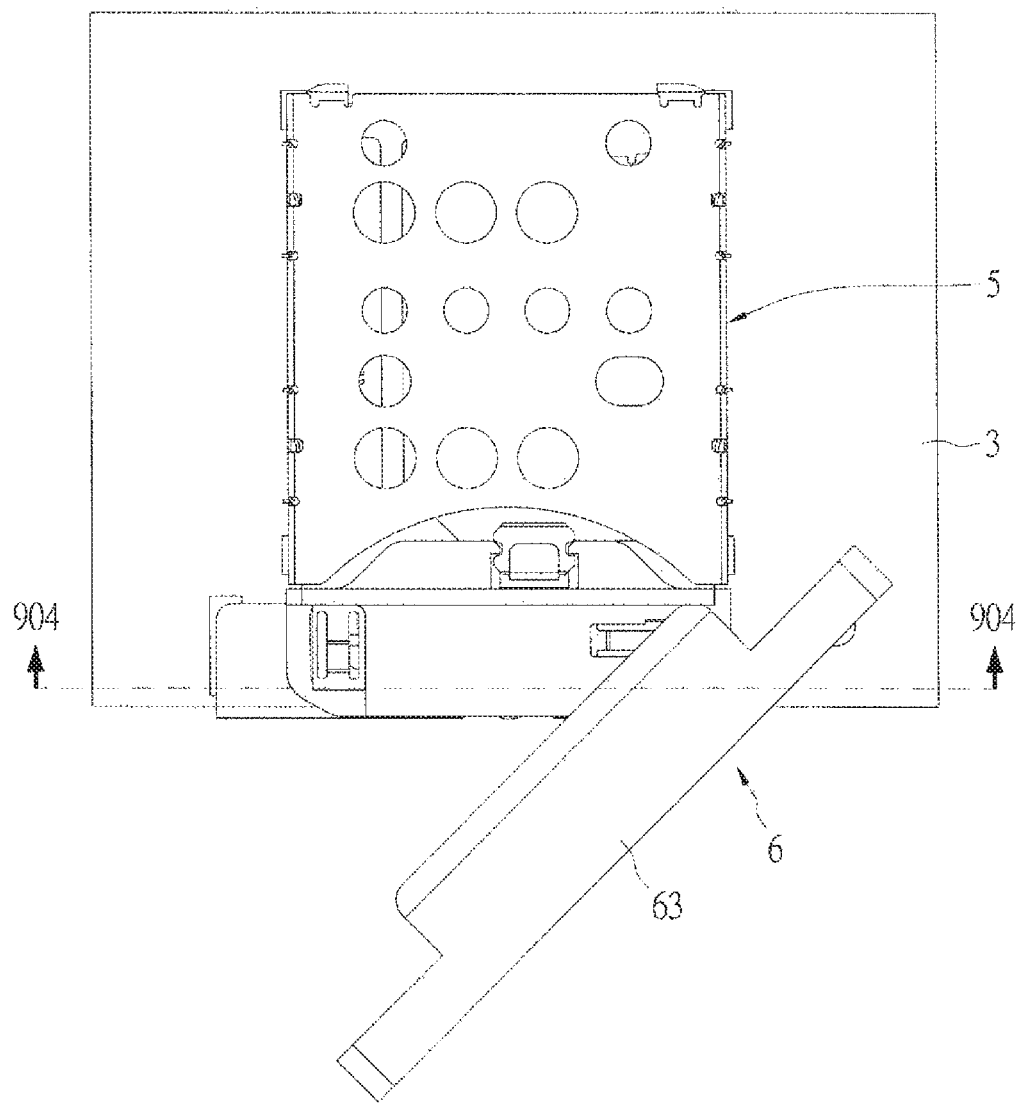
FIG. 7C is a schematic diagram of an embodiment of the present disclosure illustrating an electronic card connection device.
Figure 7D:
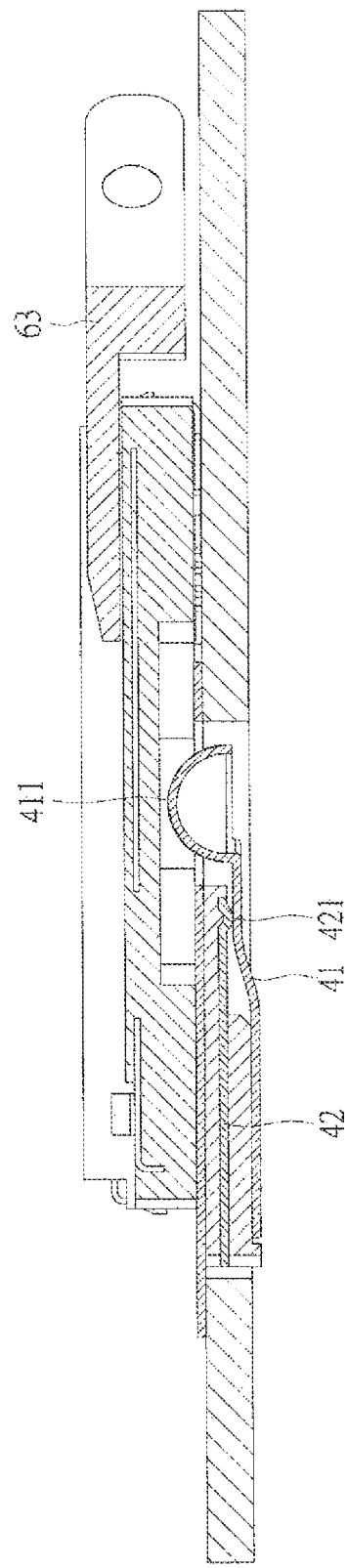
FIG. 7D is a cross-sectional view taken along a line 904-904 of FIG. 7C.

Referring to FIG. 7C and FIG. 7D, when the electronic card tray 6 is removed out of the connector 5, the push portion 633 of the operating handle 63 is pushed, and the operating handle 63 is rotated. After the operating handle 63 moves away from the position where the switch 4 is present, the movable member 41 resets back to the position when is not pressed to contact the fixed member 42. At this time, the electronic device 1 detects the actuating of the switch 4, and signal access is completed before the electronic card tray 6 is pulled out (the electronic card 8 still contacts the terminal of the connector 5). Because the switch is actuated by the movement of the operating handle 63, power may be off and signal access may be completed before the electronic card tray 6 is pulled out or moved. Therefore, the electronic device 1 may have a longer delay and ensure switching integrity of the power or signal.

In addition, referring to FIGS. 7A-7D, after the electronic card tray 6 is inserted into the connector 5, the electronic card 8 is in contact with the terminal of the connector 5 before the operating handle 63 presses the switch 4 (FIG. 7C). Next, the operating handle 63 is rotated, the electronic device 1 starts to supply power for the electronic card 8 or perform signal access after the switch 4 is pressed (FIG. 7B). Thus, it can be ensured that power is supplied or signal access is performed after the electronic card 8 is in contact with the terminal of the connector 5, switching integrity of the power or signal can be ensured.

Figure 8A:
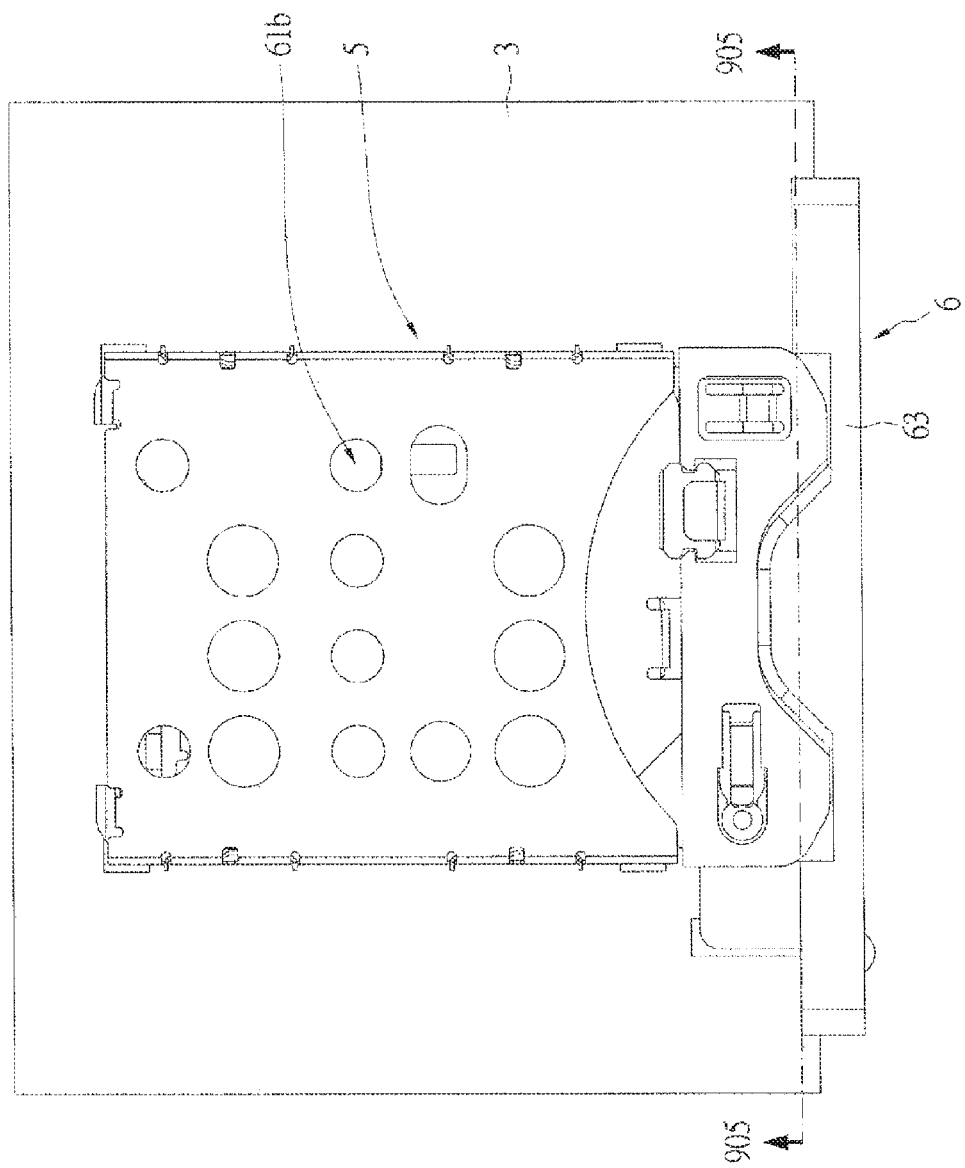
FIG. 8A is a schematic diagram of an embodiment of the present disclosure, illustrating an electronic card connection device.
Figure 8B:
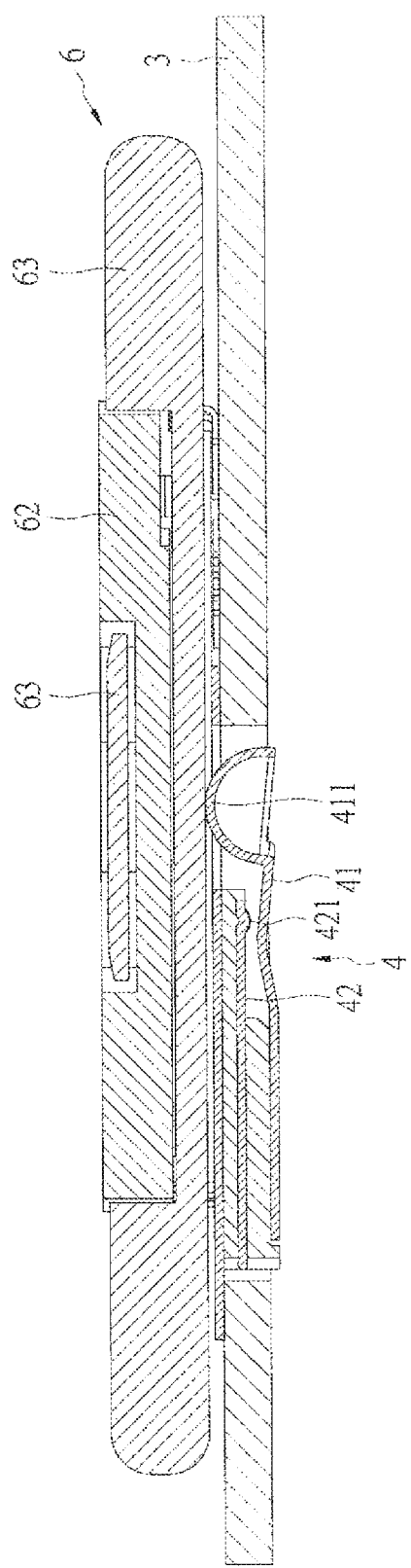
FIG. 8B is a cross-sectional view taken along a cutting 905-905 of FIG. 8A.

Referring to FIG. 7A, FIG. 7B, FIG. 8A and FIG. 8B, in an embodiment, the electronic card tray 6 comprises the first electronic card receiving recess 61a and the second electronic card receiving recess 61b which are opposite, the first electronic card receiving recess 61a may receive a first electronic card, the second electronic card receiving recess 61b may receive a second electronic card, the first electronic card and the second electronic card may be the same or different. The operating handle 63 is formed so that the switch 4 can be pressed when either the first electronic card receiving recess 61a or the second electronic card receiving recess 61b faces upward when the electronic card tray 6 is inserted into the connector 5. In the examples, as shown in FIG. 7A and FIG. 7B, the electronic card tray 6 is inserted into the connector 5 after the second electronic card receiving recess 61b receives the second electronic card, at this time the first electronic card receiving recess 61a faces upward. When the operating handle 63 rotates toward the mounting block 62 and moves to the position of the switch 4, the operating handle 63 will press the switch 4. As shown in FIG. 8A and FIG. 8B, the electronic card tray 6 is inserted into the connector 5 after the first electronic card receiving recess 61a receives the first electronic card, at this time the second electronic card receiving recess 61b faces upward. When the operating handle 63 rotates toward the mounting block 62 and moves to the position of the switch 4, the operating handle 63 will press the switch 4.

Referring to FIG. 2, in an embodiment, the operating handle 63 may comprise a front end portion 637, a first rear end portion (or first switch actuating member) 638 and a second rear end portion (or second switch actuating member) 639. A front end surface 636 of the operating handle 63 is positioned on the front end portion 637, the second switch actuating member 639 and part of the first switch actuating member 638 overlap in a vertical (or up-down) direction. After the operating handle 63 is engaged with the mounting block 62, a part of the mounting block 62 is positioned between the first switch actuating member 638 and the second switch actuating member 639.

Referring to FIG. 2, the mounting block 62 may be formed with a recessed groove 625, after the operating handle 63 is engaged with the mounting block 62, the second switch actuating member 639 may enter into the recessed groove 625. The recessed groove 625 may be provided corresponding to the position of the switch 4, so the switch 4 is not actuated before the operating handle 63 is engaged with the mounting block 62; and after the operating handle 63 is engaged with the mounting block 62, the second switch actuating member 639 will press the switch 4 to actuate the switch 4. On the other hand, when the electronic card tray 6 is turned over and mated with the connector 5, the switch 4 is not actuated before the operating handle 63 is not engaged with the mounting block 62. When the operating handle 63 is engaged with the mounting block 62, the first switch actuating member 638 will press the switch 4 to actuate the switch 4. Because the operating handle 63 has the first switch actuating member 638 and the second switch actuating member 639, the electronic card tray 6 is inserted into connector whether the first electronic card receiving recess 61a or the second electronic card receiving recess 61b faces upward, the operating handle 63 can actuate the switch 4.

Figure 9A:
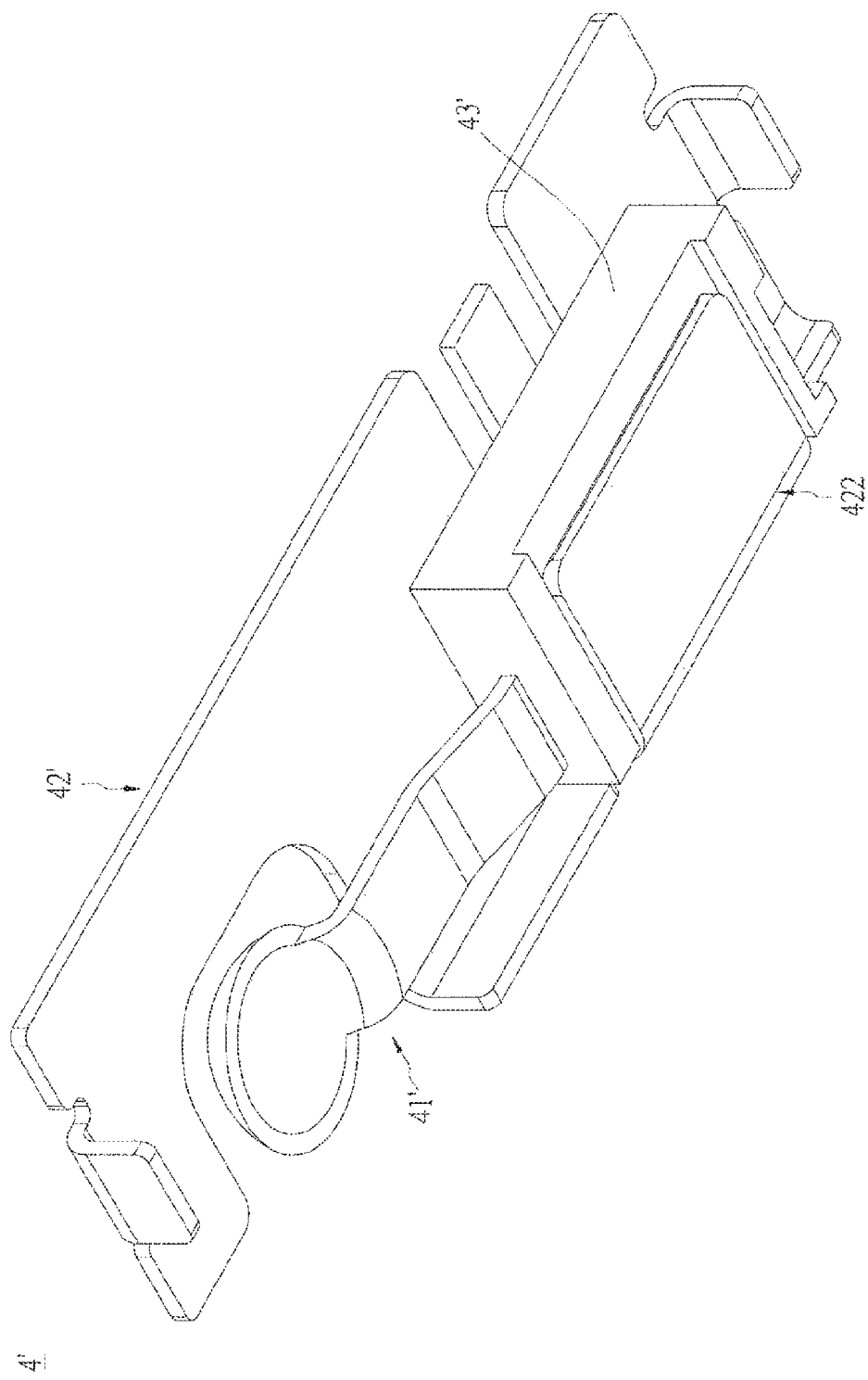
FIG. 9A is a schematic diagram of another embodiment of the present disclosure illustrating another switch.
Figure 9B:
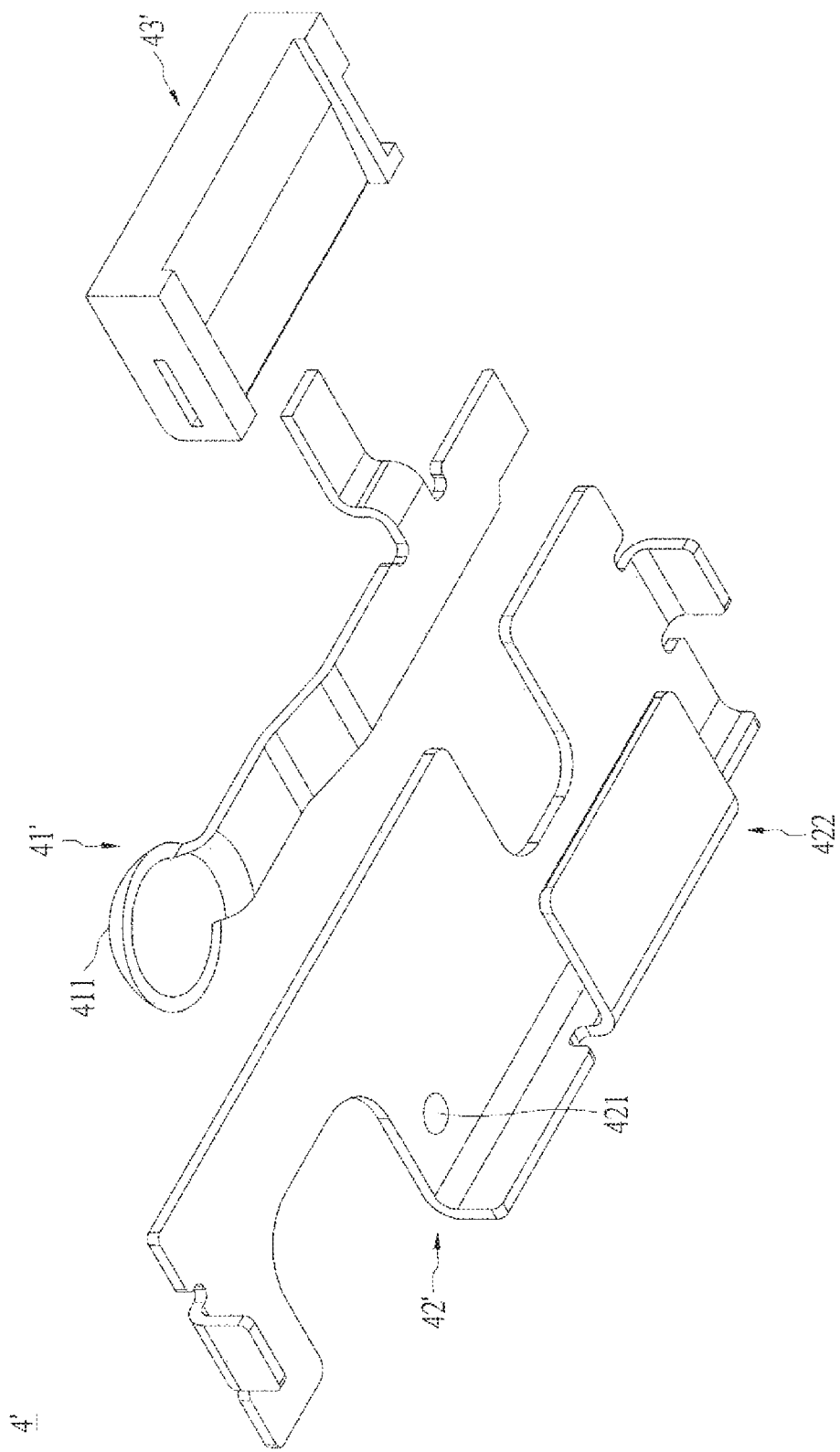
FIG. 9B is an exploded view of the switch of FIG. 9A.
Figure 10A:
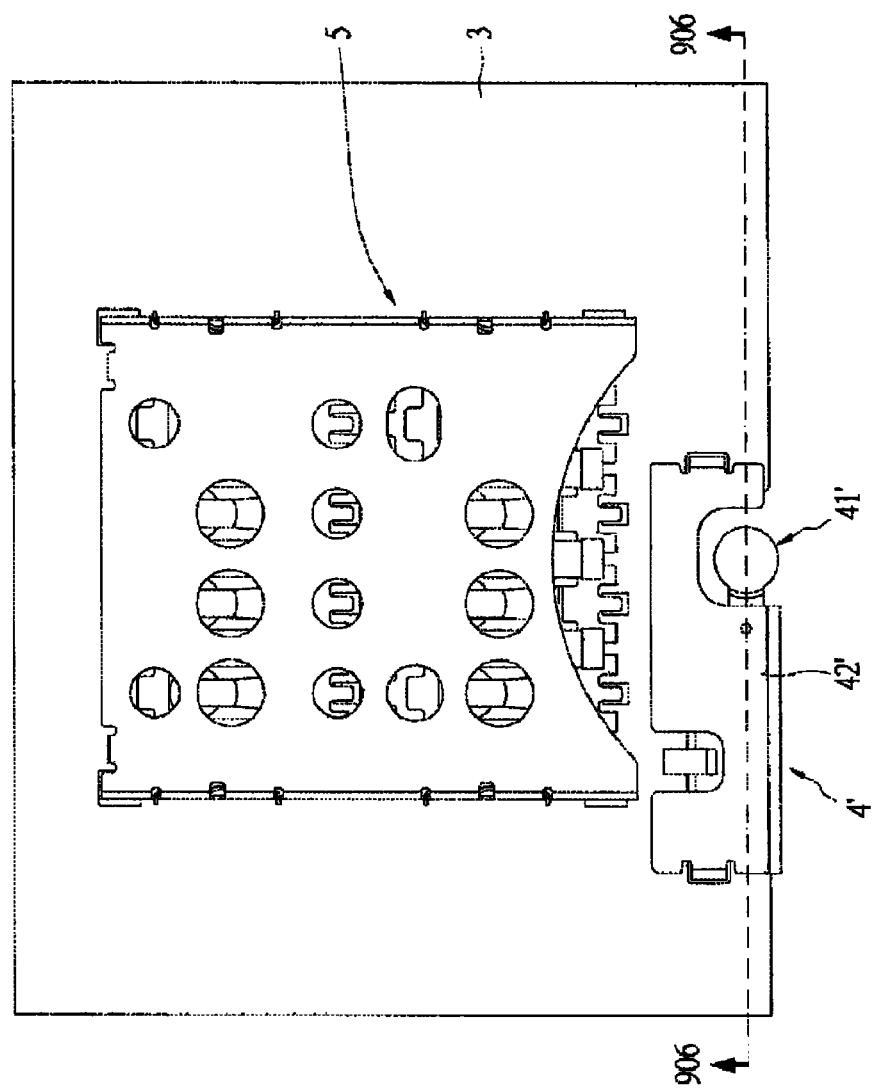
FIG. 10A is a schematic diagram of an embodiment of the present disclosure illustrating the switch and the connector are mounted on the circuit board.
Figure 10B:
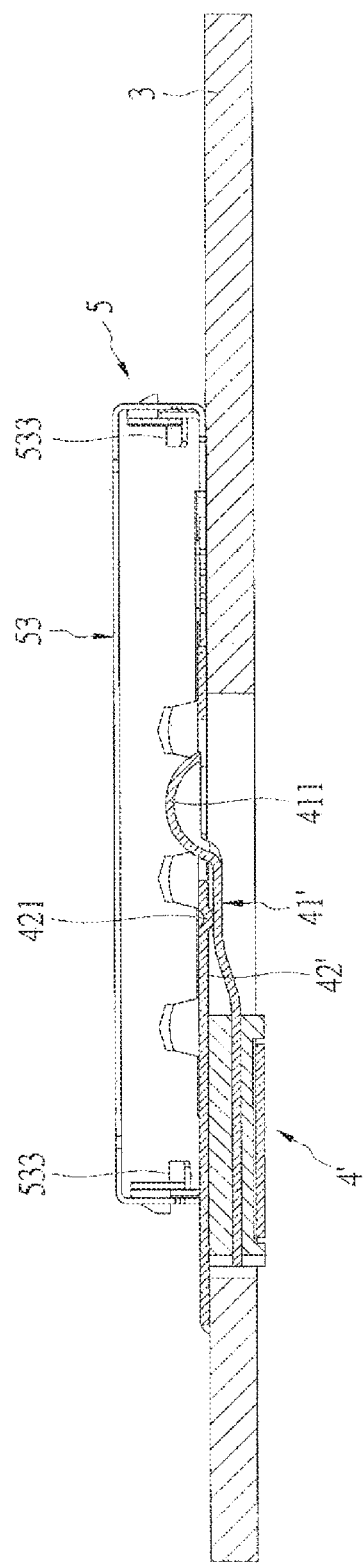
FIG. 10B is a cross-sectional view taken along a line 906-906 of FIG. 10A.

FIG. 9A is a schematic diagram of another embodiment of the present disclosure illustrating another switch 4'. FIG. 9B is an exploded view of the switch 4' of FIG. 9A. FIG. 10A is a schematic diagram of an embodiment of the present disclosure illustrating the switch 4' and a connector 5 are mounted on the circuit board 3. FIG. 10B is a cross-sectional view taken along a line 906-906 of FIG. 10A. Referring to FIG. 9A and FIG. 9B, the switch 4' comprises a movable member 41', a fixed member 42' and an insulative body 43'. The movable member 41' may contact or be moved away from the fixed member 42'. The insulative body 43' electrically isolates the movable member 41' and the fixed member 42'. In an embodiment, a combination of the movable member 41', the fixed member 42' and the insulative body 43' may be integrally molded. In an embodiment, the fixed member 42' comprises a clamp portion 422, and the insulative body 43' may be clamped on the clamp portion 422. In an embodiment, the movable member 41' may be partially embedded in the insulative body 43'.

As shown in FIG. 9B, in an embodiment, the fixed member 42' may comprise a contact point 421. After a combination of the movable member 41' and the insulative body 43', and the fixed member 42' are assembled together, the movable member 41' may contact the contact point 421 of the fixed member 42'; but the present disclosure is not limited to this.

In an embodiment, the switch 4' is a normally closed. In an embodiment, the switch 4' is a normally open.

The operating handle 63 may be used for switching the switch 4'. As shown in FIG. 10B, the movable member 41' comprises a press portion 411. After the switch 4' is mounted, the press portion 411 may partially protrude into the rotation range 60 of the operating handle 63, allowing the operating handle 63 to contact the press portion 411. In an embodiment, when the electronic card tray 6 is inserted into the connector 5 and the operating handle 63 in not in contact with the press portion 411, the press portion 411 is not pressed, at this time the switch 4' is maintained in a normal state (a normally closed state or a normally open state, and the normally closed state is in the present embodiment). When the operating handle 63 is rotated through the press portion 411, the operating handle 63 will press down on the press portion 411, at this time the switch 4' is actuated.

Figure 11A:
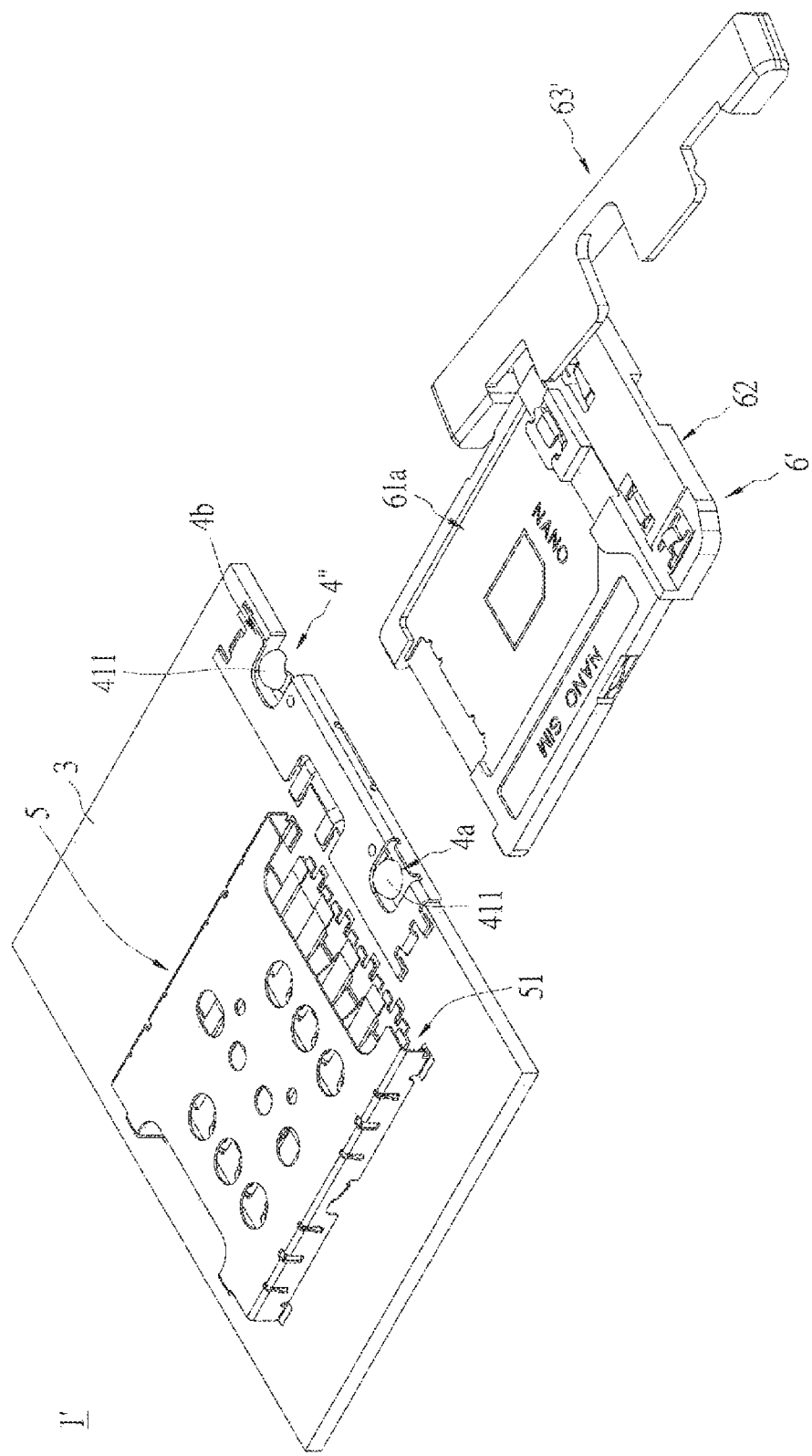
FIG. 11A is a schematic diagram of an embodiment of the present disclosure illustrating a circuit board, a connector, an electronic card tray and a switch group of an electronic device.
Figure 11B:
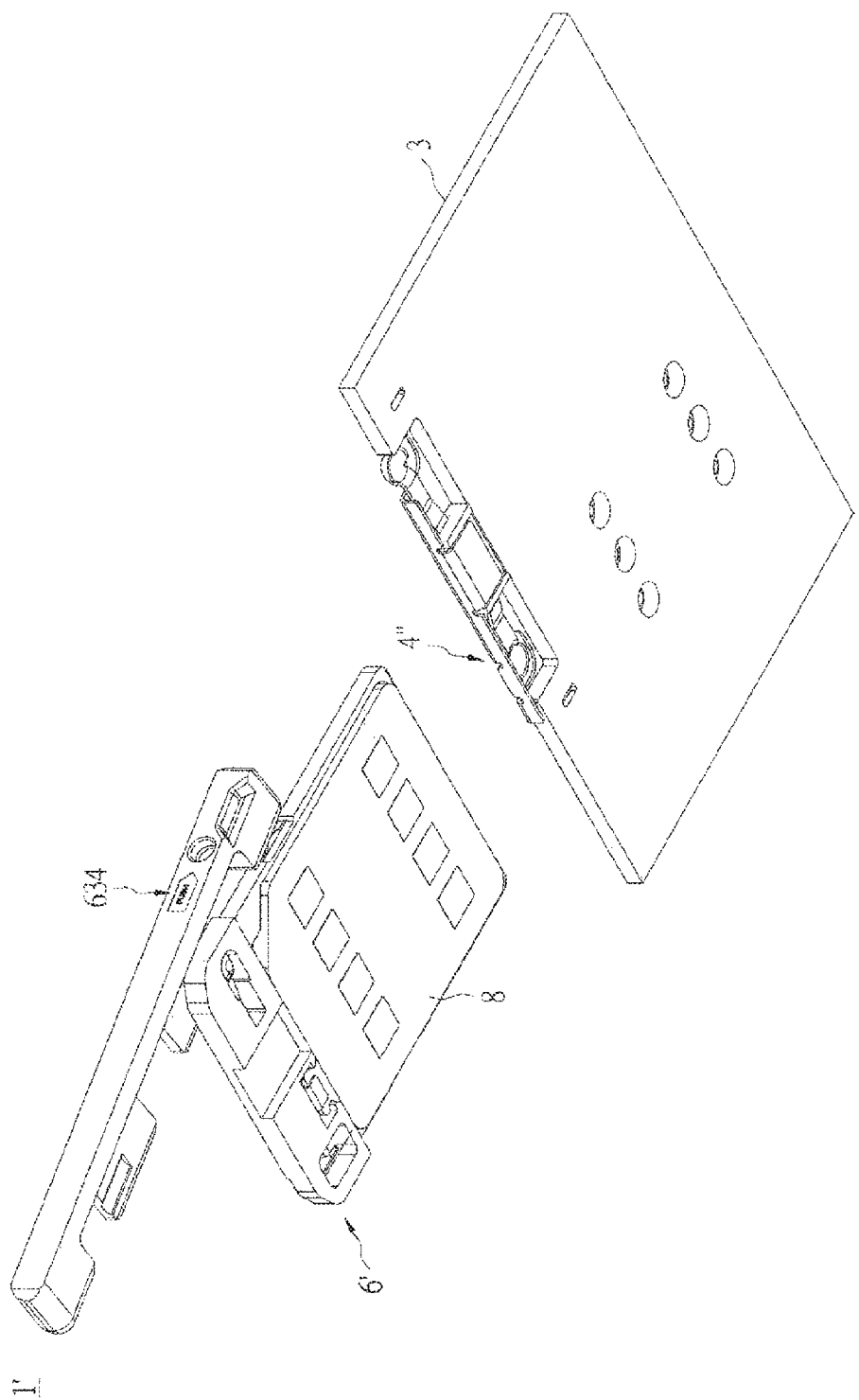
FIG. 11B is another schematic diagram of the embodiment of the present disclosure, illustrating the circuit board, the connector, the electronic card tray and the switch group of the electronic device.

FIG. 11A is a schematic diagram of an embodiment of the present disclosure illustrating a circuit board 3, a connector 5, an electronic card tray 6' and a switch group 4" of an electronic device 1'. FIG. 11B is another schematic diagram of an embodiment of the present disclosure, illustrating the circuit board 3, the connector 5, the electronic card tray 6' and the switch group 4" of the electronic device. Referring to FIG. 11A and FIG. 11B, the electronic device 1' comprises a circuit board 3, a connector 5, an electronic card tray 6' and a switch group 4". The connector 5 is provided on the circuit board 3. The connector 5 comprises a mating space 51. The electronic card tray 6' may be inserted into the mating space 51. The electronic card tray 6' comprises an electronic card receiving recess 61a, a mounting block 62 positioned in front of the electronic card receiving recess 61a and an operating handle 63' pivotally connected to the mounting block 62. The switch group 4" can detect whether there is an electronic card on the inserted electronic card tray 6', and can detect whether the electronic card tray 6' is inserted into the connector 5.

Referring to FIG. 11B, in an embodiment, the operating handle 63 may be provided with a marking 634, the marking 634 comprises a marking or indicating pattern, the marking 634 is used for indicating the pressed position when the operating handle 63 is rotated.

Figure 12A:
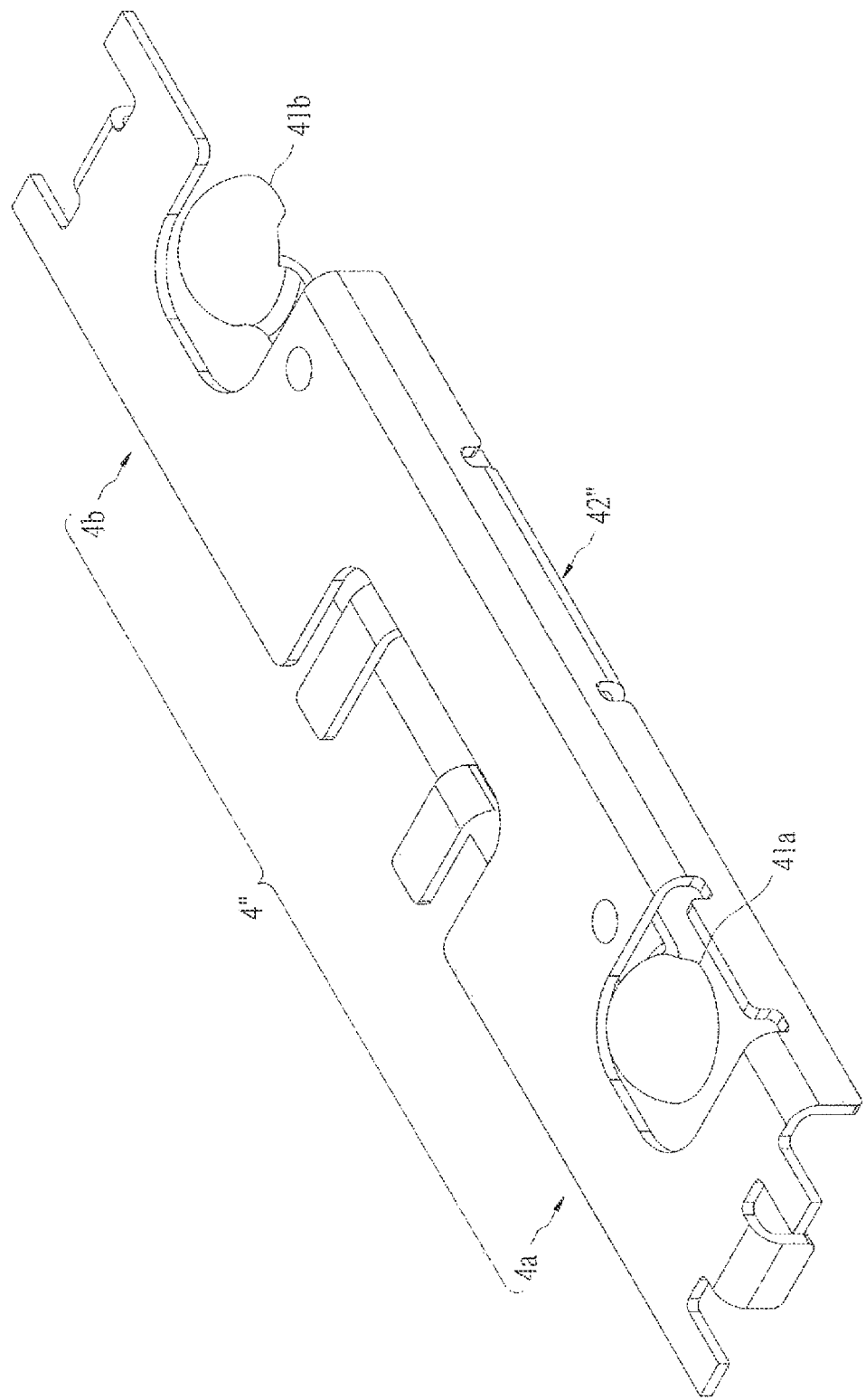
FIG. 12A is a schematic diagram of an embodiment of the present disclosure illustrating a switch group.
Figure 12B:
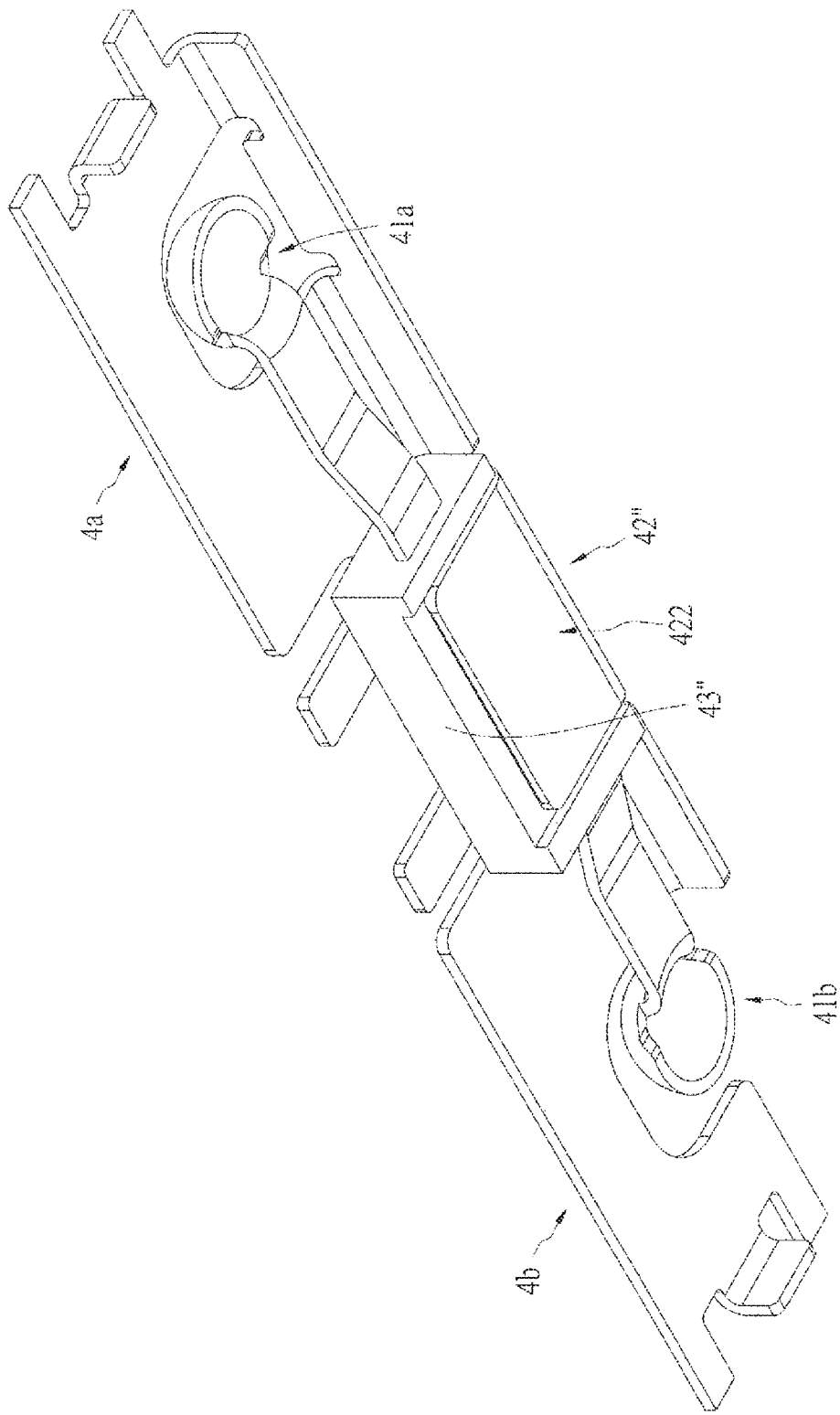
FIG. 12B is another schematic diagram of the embodiment of the present disclosure illustrating the switch group.
Figure 12C:
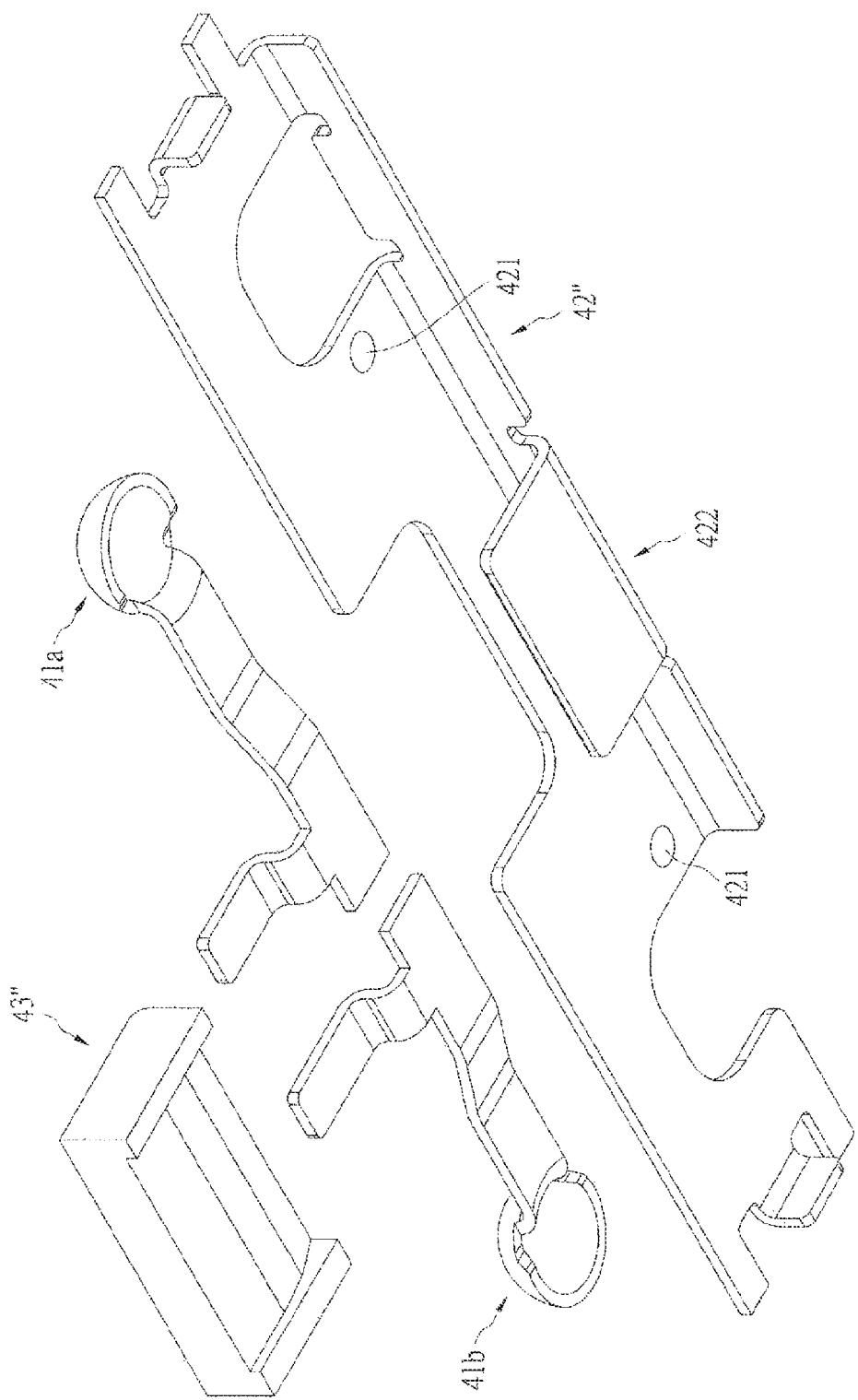
FIG. 12C is an exploded schematic diagram of the embodiment of the present disclosure illustrating the switch group.

FIG. 12A is a schematic diagram of an embodiment of the present disclosure illustrating a switch group 4". FIG. 12B is another schematic diagram of the embodiment of the present disclosure illustrating the switch group 4". FIG. 12C is an exploded schematic diagram of the embodiment of the present disclosure illustrating the switch group 4". Referring to FIGS. 12A-12C, the switch group 4" comprises two movable members 41a, 41b, a fixed member 42" and an insulative body 43". Each movable member 41a or 41b and the fixed member 42" are combined into a switch (4a or 4b). Two movable members 41a, 41b and the fixed member 42" and the insulative body 43" may be integrally molded. The fixed member 42" may comprise a clamp portion 422, and the insulative body 43" may be clamped on the clamp portion 422. In an embodiment, the movable member 41a or 41b may be partially embedded in the insulative body 43". In an embodiment, the insulative body 43" comprises two separated insulating blocks.

As shown in FIG. 12C, the fixed member 42" may comprise two contact points 421, if the switch (4a or 4b) is normally closed, the movable member 41a or 41b contact the corresponding contact point 421 respectively in the normal state; if the switch (4a or 4b) is normally open, the movable member 41a, 41b is separated from the corresponding contact point 421 in the normal state.

Referring to FIGS. 11A and 12B, the movable member 41a or 41b comprises a press portion 411. The press portion 411 may partially protrude into the rotation range 60 of the operating handle 63'. The press portion 411 of the movable member 41a is provided in front of the connector 5, so the electronic card 8 will press the press portion 411 when the electronic card tray 6' loaded with the electronic card 8 is inserted into the connector 5 to change the state of the switch 4a. Thus, the electronic device 1' can detect that the inserted electronic card tray 6' is loaded with the electronic card. Furthermore, because the switch 4a is used for detecting whether the electronic card tray 6' is loaded with the electronic card 8, in order to avoid misjudgment, the electronic card tray 6' itself is not in contact with the press portion 411 of the movable member 41a; that is when an empty electronic card tray 6' is mated, the switch 4a is not actuated.

In addition, the press portion 411 of the movable member 41b is not provided in front of the connector 5. The press portion 411 of the movable member 41b may be provided in front of and alongside the connector 5, and provided at the position where the press portion 411 can be pressed after the operating handle 63' is engaged with the mounting block 62. Thus, the electronic device 1' begins to supply power for the electronic card 8 or perform signal access by actuating the switch 4b.

In an embodiment, the two switches 4a, 4b of the switch group 4" are connected together. In another embodiment, the two switches 4a, 4b of the switch group 4" are independently separated.

The electronic card tray 6 may be removed out of the connector 5 easily by steps of pushing, rotating, pulling the operating handle 63. Referring to FIG. 13A, the electronic card connection device 2 may be mounted in an electronic device 1. The electronic device 1 may comprise a mobile device, such as a panel computer, a mobile phone or the like, but the present disclosure is not limited to this. The electronic device 1 may be not a mobile device. The electronic device 1 may comprise a circuit board 3 and a casing 11. The connector 5 of the electronic card connection device 2 may be provided on the circuit board 3. The casing 11 comprises an opening 111, the opening 111 is communicated to the mating space 51 of the connector 5, so the electronic card tray 6 may be inserted into the mating space 51 of the connector 5 via the opening 111. The opening is configured to have a top side and a bottom side that are arranged along a vertical direction. The top side corresponds to an upward direction and the bottom side corresponds to a downward direction.

Referring to FIG. 13A and FIG. 13B, the push portion 633 of the operating handle 63 is determined according to the marking 634 on the operating handle 63. Next, the push portion 633 is pushed by use of any suitable object 7 (for example: a pen, a round bar, etc.), the operating handle 63 is unlocked and rotated, an opposite end 635 of the push portion 633 on the operating handle 63 protrudes out from the casing 11 to facilitate user gripping.

Figure 13C:
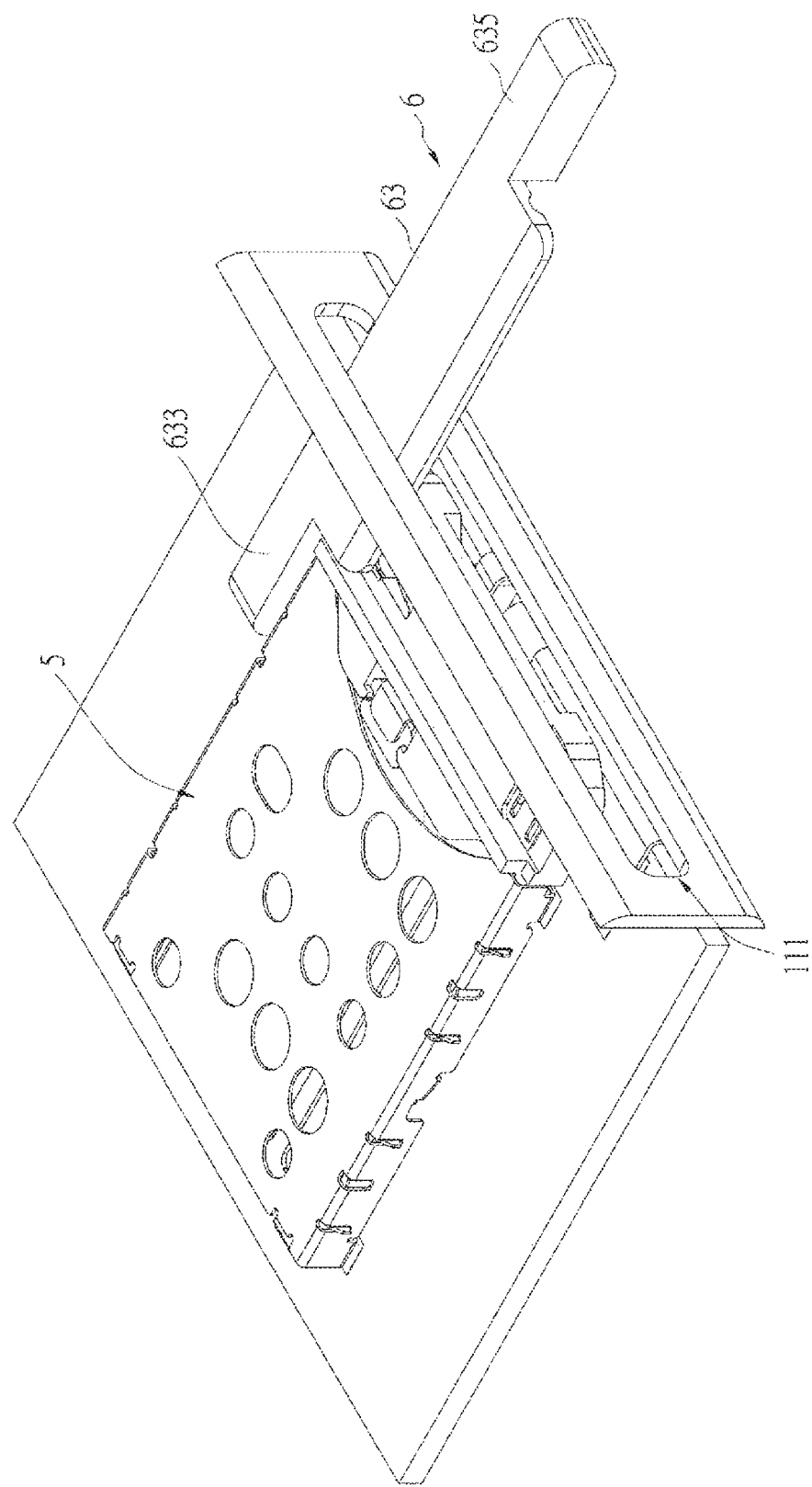

Referring to FIG. 13C, after the operating handle 63 is pushed, the operating handle 63 may be further rotated until the operating handle 63 is roughly parallel to a mating direction of the electronic card tray 6. At this time the push portion 633 of the operating handle 63 is positioned alongside the connector 5.

Figure 13D:
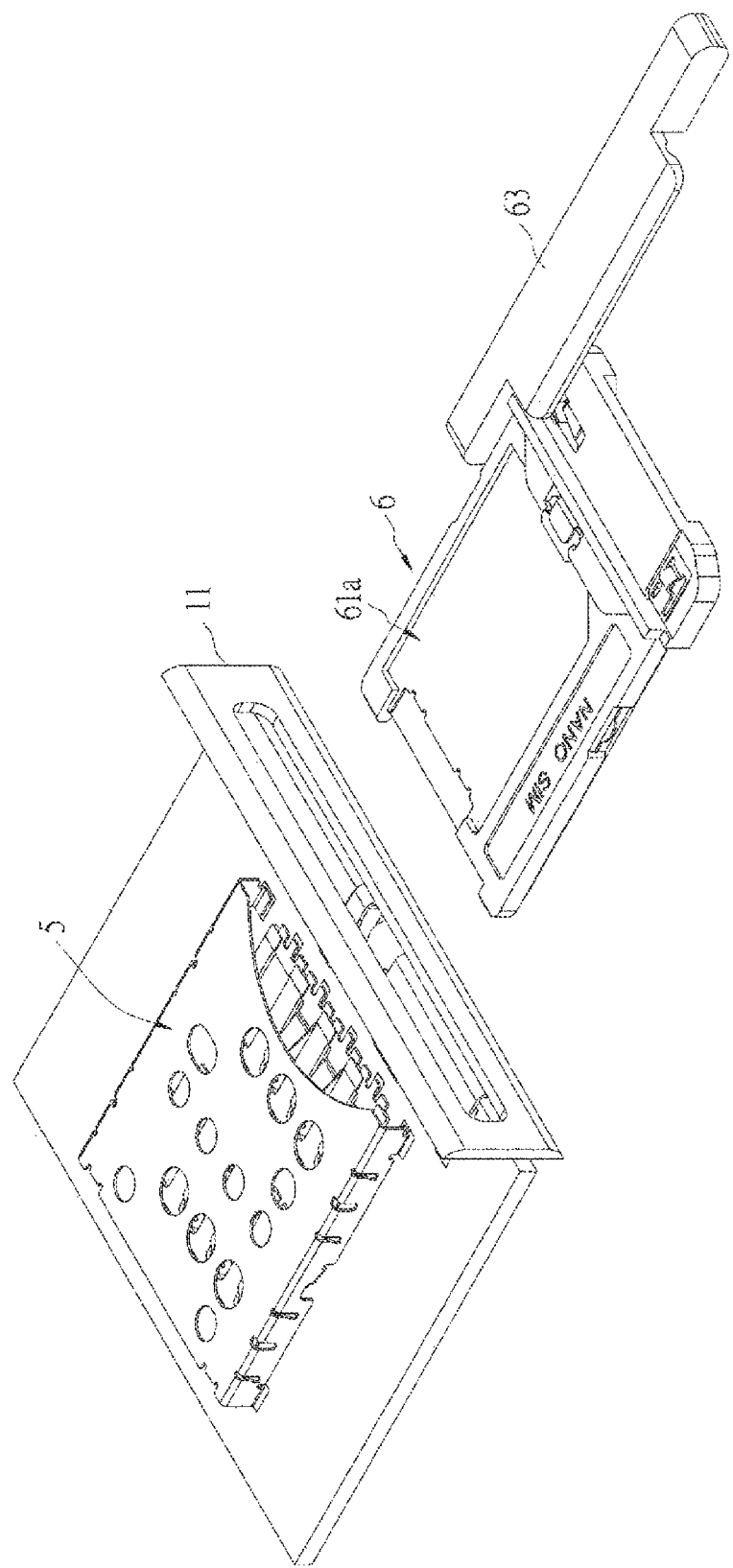

Referring to FIG. 13D, then, the user may grip the operating handle 63 to pull the electronic card tray 6 out of the connector 5.

Figure 13E:
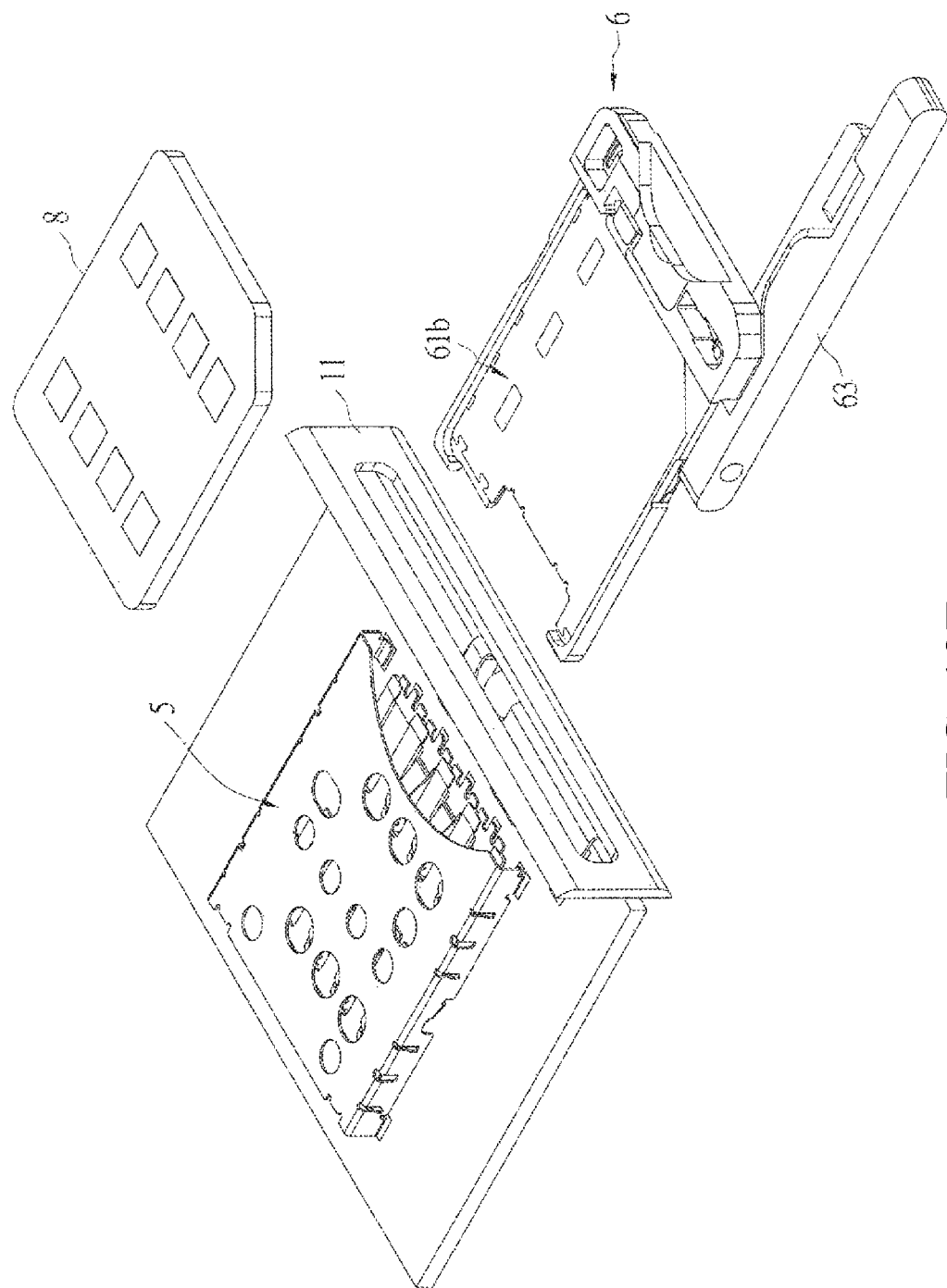

Referring to FIG. 13E, next, the electronic card tray 6 is turned over to allow the electronic card 8 positioned below to face upward, so the electronic card 8 may be removed out of the electronic card tray 6.

In an embodiment, the steps for mounting the electronic card 8 are firstly mounting the electronic card 8 on the electronic card tray 6. Next, the electronic card tray 6 is turned over to allow the electronic card 8 to face downward to facilitate electrically connecting the terminal of the connector 5 positioned below. Then, the operating handle 63 is gripped and the electronic card tray 6 is inserted into the connector 5 via the opening 111 of the casing 11 until the electronic card tray 6 is fully inserted. Next, the operating handle 63 is pressed, and the operating handle 63 is rotated until the locking portion 632 of the operating handle 63 is engaged.

In an embodiment, the electronic card tray 6 is removed out of the connector 5 by pushing, rotating, pulling the operating handle 63, therefore, the electronic card connection device 2 does not have to provide a card ejecting mechanism, the electronic card connection device 2 has low cost. In an embodiment, because the push portion 633 is positioned in front of the electronic card tray 6 and has a large range of surface which may allow an easily accessible object such as a pen, a bar or a rod to press, without using a special card ejecting pin, therefore, the electronic card connection device 2 is very convenient in use.

Referring to FIG. 13A, in an embodiment, after the electronic card tray 6 is inserted into connector 5 and the operating handle 63 is engaged with the mounting block 62, the front end surface 636 of the operating handle 63 of the electronic card tray 6 and the casing surface 1111 near the opening 111 of the casing 11 constitute a continuous surface, thus the appearance of the electronic device 1 is smooth and continuous.

Referring to FIG. 5A, in an embodiment, after the operating handle 63 is engaged with the mounting block 62, the push portion 633 protrudes out from the mounting block 62 along a transverse direction (transverse to a mating direction of the electronic card tray), so the operating handle 63 may be unlocked and pushed easily.

Referring to FIG. 1 and FIG. 2, the electronic card tray 6 comprises an insulative frame body 64 and a metal bottom plate 65. A combination of the insulative frame body 64 and the metal bottom plate 65 may be integrally injection molded. The insulative frame body 64 may comprise a peripheral wall 641, and the peripheral wall 641 and the metal bottom plate 65 define an electronic card receiving recess 61a or 61b. In an embodiment, the peripheral wall 641 and the metal bottom plate 65 define two electronic card receiving recesses 61a, 61b. The insulative frame body 64 may also comprise a part which is positioned in front of the electronic card receiving recess 61a or 61b, and partially constitutes the mounting block 62. In an embodiment, the peripheral wall 641 may be continuous. In an embodiment, the peripheral wall 641 may be not continuous.

Referring to FIG. 3 and FIG. 4, in some embodiments, the metal bottom plate 65 comprises a pivot hole 621. In some embodiments, the metal bottom plate 65 comprises a mounting hole 622. In some embodiments, the metal bottom plate 65 comprises a resilient protruding portion 624. In some embodiments, the metal bottom plate 65 comprises a retaining piece 623.

Figure 14:
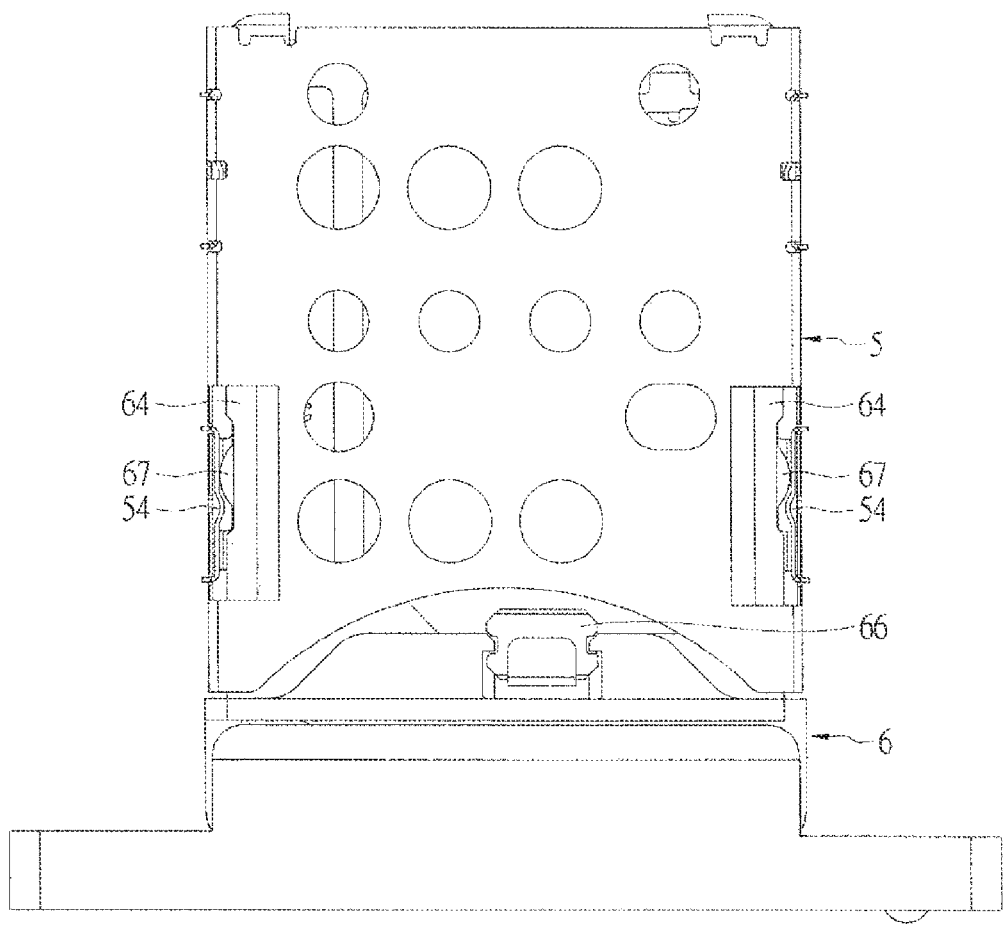
FIG. 14 is a schematic diagram of an embodiment of the present disclosure, illustrating an electronic card connection device.

FIG. 14 is a schematic diagram of an embodiment of the present disclosure illustrating an electronic card connection device. Referring to FIG. 14, the electronic card tray 6 comprises an abutting block 66. The abutting block 66 is used for fixing the electronic card mounted on the electronic card tray 6, so the electronic card is not easily disengaged. The abutting block 66 may be provided corresponding to the electronic card receiving recess 61a or 61b. The abutting block 66 may partially protrude into the corresponding electronic card receiving recess 61a or 61b. The abutting block 66 has resiliency. In an embodiment, the abutting block 66 comprises a rubber. Because the abutting block 66 can secure the electronic card, the electronic card is not displaced after mounted on the electronic card receiving recess 61a or 61b.

Referring to FIG. 3 and FIG. 4, in an embodiment, the abutting block 66 comprises two recessed grooves 661 which are provided oppositely, the electronic card tray 6 has two corresponding protruding portions 642. After the abutting block 66 is mounted on the electronic card tray 6, each protruding portion 642 is engaged with the corresponding recessed groove 661 to fix the abutting block 66 or ensure a distance for which the abutting block 66 protrudes out from the corresponding electronic card receiving recess 61a or 61b.

Referring to FIG. 3 and FIG. 4, in an embodiment, the electronic card tray 6 comprises a metal bottom plate 65, the metal bottom plate 65 comprises a receiving channel 651. The receiving channel 651 is provided corresponding to the abutting block 66. The abutting block 66 may be mounted in the corresponding receiving channel 651. In an embodiment, the receiving channel 651 may clamp the corresponding abutting block 66.

Figure 15:
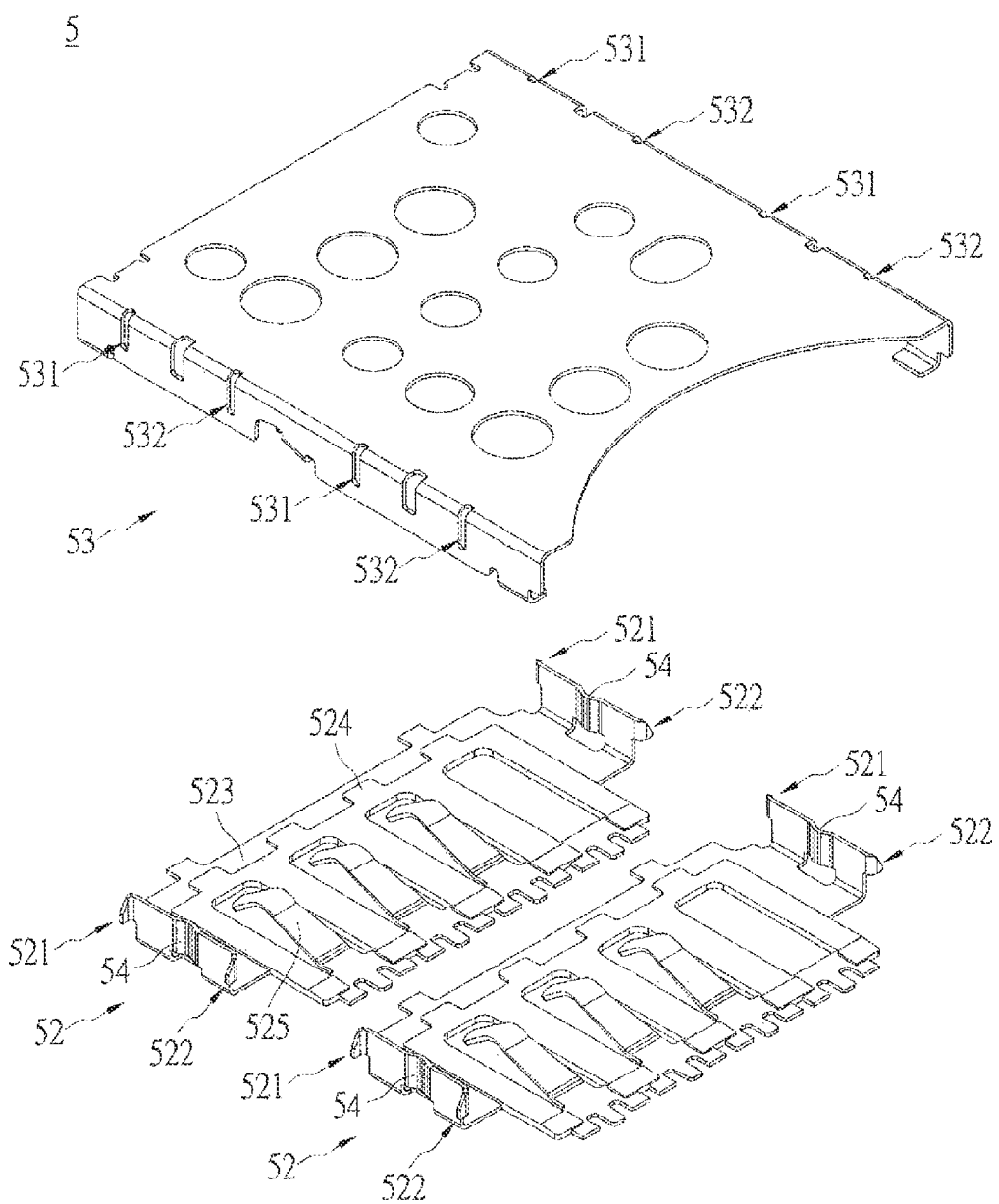
FIG. 15 is a schematic diagram of an embodiment of the present disclosure, illustrating a connector.

FIG. 15 is a schematic diagram of an embodiment of the present disclosure illustrating a connector 5. As shown in FIG. 15, the connector 5 comprises a terminal housing 52 and a shell 53. Each side edge of the terminal housing 52 comprises a first latch portion 521, and each side edge of the shell 53 comprises a corresponding second latch portion 531, each first latch portion 521 and the corresponding second latch portion 531 may be engage each other with a clearance fit. The terminal housing 52 may rotate at an engagement position of the first latch portion 521 and the second latch portion 531 relative to the shell 53. Because the first latch portion 521 and the second latch portion 531 are engaged in clearance fit, and the connector 5 is mounted on the circuit board 3, the shell 53 and the terminal housing 52 are not restricted mutually but can be adjusted separately, so the coplanarity between the soldering part of the shell 53 and the soldering part of the terminal housing 52 on the circuit board can be ensured.

In an embodiment, the first latch portion 521 comprises a protrusion, and the second latch portion 531 comprises a latch frame. In another embodiment, the first latch portion 521 comprises a latch frame, and the second latch portion 531 comprises a protrusion. In an embodiment, the protrusion engaging the latch frame is a hook.

Referring to FIG. 15, each side edge of the terminal housing 52 may comprise a first limiting portion 522, and each side edge of the shell 53 may comprise a corresponding second limiting portion 532, the first limiting portion 522 and the second limiting portion 532 engage each other with a clearance fit, and a limiting mechanism constituted by first limiting portion 522 and the second limiting portion 532 can limit rotation of the terminal housing 52 relative to the shell 53.

In an embodiment, the first limiting portion 522 comprises a protrusion, and the second limiting portion 532 comprises a latch frame. In an embodiment, the first limiting portion 522 comprises a latch frame, and the second limiting portion 532 comprises a protrusion. In an embodiment, the protrusion engaging the latch frame is a hook.

Referring to FIG. 15, the terminal housing 52 comprises a metal frame body 523, an insulative body 524 and a plurality of terminals 525, and the metal frame body 523 is embedded in and fixed to the insulative body 524, the plurality of terminals 525 are embedded in and fixed to the insulative body 524.

Figure 16:
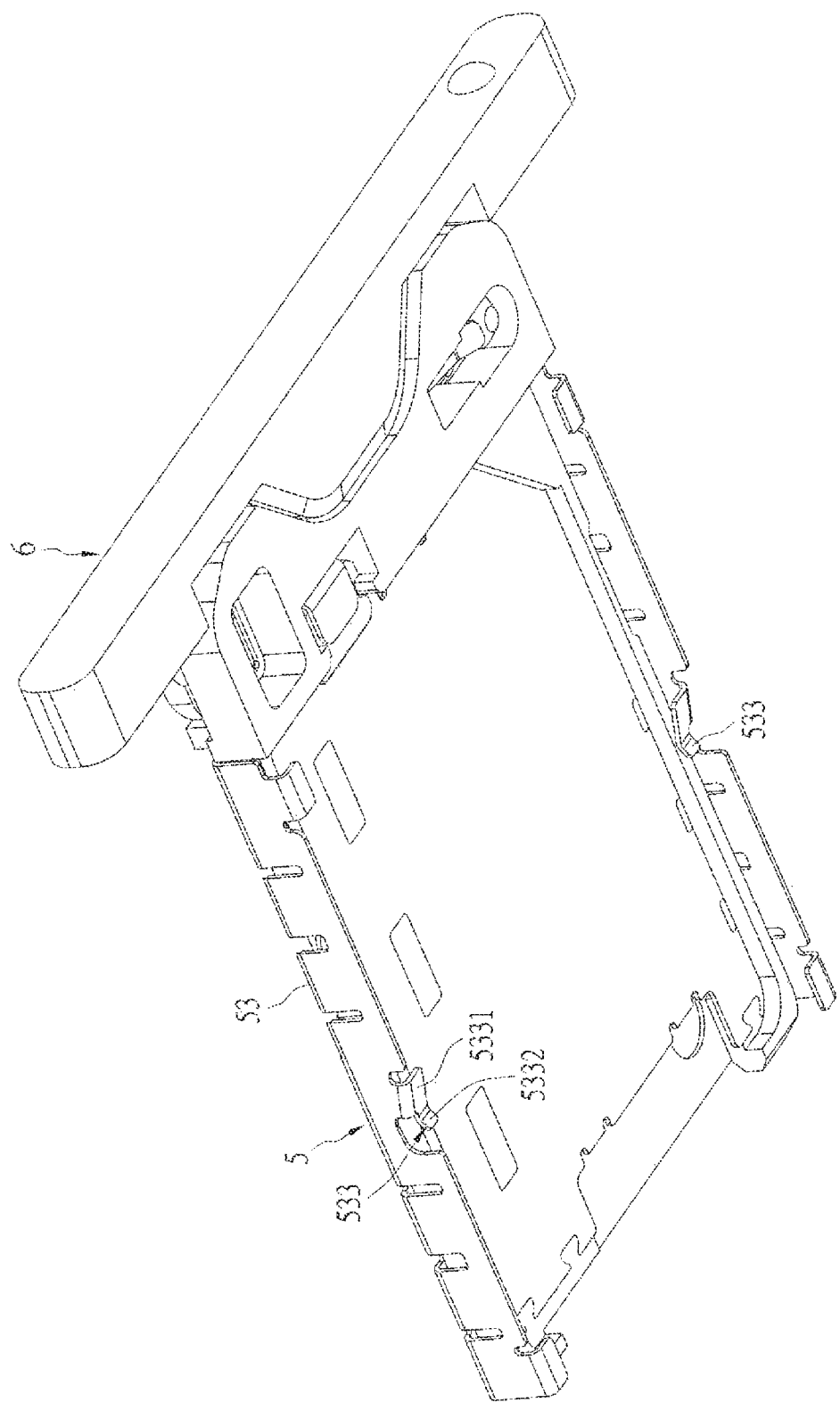
FIG. 16 is a schematic diagram of an embodiment of the present disclosure, illustrating a support element of the shell of the connector.

FIG. 16 is a schematic diagram of an embodiment of the present disclosure illustrating a support element 533 of the shell 53 of the connector 5. Referring to FIG. 11B and FIG. 16, the shell 53 comprises a support element 533 which partially extends obliquely upward along the mating direction of the electronic card tray 6. The support element 533 is positioned in the mating space 51 of the connector 5, and comprises a guide portion 5331 extending obliquely upward along the mating direction of the electronic card tray 6 and a support portion 5332 capable of supporting the electronic card tray 6. When the electronic card tray 6 is inserted into the connector 5, the electronic card tray 6 will be moved upwardly to a sufficient height by the support element 533, so the electronic card tray 6 is not in contact with the terminal 525 of the connector 5a avoiding damage to the terminal 525 caused by the contact. In an embodiment, the support element 533 is positioned near the middle position of the side edge of the shell 53 in the mating direction. In an embodiment, the support element 533 is positioned between the two terminal housings 52.

Referring to FIG. 2, an end portion of the electronic card tray 6 has a transverse cutout 68 opposite to the operating handle 63 or the mounting block 62, the transverse cutout 68 may be provided for cooperating with the support element 533 to avoid the terminal 525 of the connector 5 when the empty electronic card tray 6 is inserted, and avoid contact of the terminal 525.

Referring to FIG. 14, the connector 5 comprises a latching portion 54 protruding toward the mating space 51, and the electronic card tray 6 correspondingly comprises a protruding block 67. The protruding block 67 may protrude laterally from the electronic card tray 6, protrude out from a corresponding side wall surface of the insulative frame body 64, and may be latched with the corresponding latching portion 54 of the connector 5 after the electronic card tray 6 is inserted into the connector 5, thereby increasing the retention force and durability of the electronic card tray 6 in the connector 5. In an embodiment, the latching portion 54 is formed on the terminal housing 52. In an embodiment, the latching portion 54 is formed on the shell 53 of the connector 5. In an embodiment, the latching portion 54 may be a protrusion formed by protruding but not breaking a part of the side edge of the terminal housing 52 or shell 53 by punching. In an embodiment, the latching portion 54 may comprise a protrusion on the elastic piece having a free end.

Referring to FIG. 4, in an embodiment, the metal bottom plate 65 comprises a protruding block 67. In an embodiment, the protruding block 67 has a curved edge.

In some embodiments of the present disclosure, a front end of the electronic card tray is provided with a pivotable operating portion. The electronic card tray mates with the connector and the power supply and signal transmission of the connector may be controlled by a switch. The switch is actuated using the operating portion, and is not actuated using the moving electronic card tray ensuring switching integrity of the power or signal, and avoid damage to the electronic device and the electronic card or the stored data caused by inappropriate switching of the switch.

In some embodiments, both sides of the electronic card tray may be fitted with different electronic cards. The electronic card tray may be inserted into the connector by reversible rotation on both sides, and the switch may be actuated using the operating portion in these two mating ways. In other words, the electronic card tray has a first side and an opposing second side, and in one instance the electronic card tray is inserted into the connector with the first side facing upwards and in another instance the electronic card tray is inserted with the opposing side facing upwards.

In some embodiments of the present disclosure, the front end of the electronic card tray is provided with a pivotable operating portion. The operating portion may be pushed to rotate and protrude out forward partially from the electronic device, so that the user can easily grip and pull out the electronic card tray. The operating portion may replace a complicated card ejecting mechanism reducing the cost of the connector.

Furthermore, because the operating portion is positioned at the front end of the electronic card tray, the user does not need to prepare a special card ejecting pin, and the electronic card is ejected only using a common pen or round bar, therefore, the electronic card tray in some embodiments of the present disclosure is very convenient in use.

In addition, in some embodiments of the present disclosure, the electronic card tray may be loaded with the electronic cards having different sizes on both sides, therefore, the electronic card tray in some embodiments of the present disclosure is widely used.

In some embodiments of the present disclosure, the operating portion of the electronic card tray is pivotally connected to the mounting block of the electronic card tray, the operating portion is provided with a locking portion to lock the operating portion on the mounting block to fix the operating portion.

In some embodiments of the present disclosure, the electronic card tray can secure the electronic card avoiding damage to the electronic card data or the electronic device circuit caused by untimely power off or power supply in the inserting and pulling process.

In some embodiments of the present disclosure, the connector and the electronic card tray may be engaged with each other, thereby increasing retention force and durability of the electronic card tray in the connector.

In some embodiments of the present disclosure, the connector can support and lift the electronic card tray and avoid contact between the terminal of the connector and the empty electronic card tray.

In the embodiments of the present disclosure, directions or moving directions such as up, down, left, right, front, rear and others, used to explain the structures or components, are not absolute, but relative. The adopted directions are appropriate when the disclosed components are in the same orientation in the embodiments shown in the Figures. However, if positions or reference coordinates of the disclosed embodiments change, the adopted directions change when the positions or reference coordinates in the embodiments change.

Technical contents and technical features of the present disclosure are disclosed as above, but person skilled in the art still can make various substitutions and modifications without departing from the technology spirit of the present disclosure based on the content and disclosure of the present disclosure. Therefore, the protection scope of the present disclosure should not be limited to the contents disclosed by the embodiments, but should include various substitutions and modifications disclosed without departing the present disclosure, and is included by the Claims of the present disclosure.

What is claimed is:

1. An electronic device, comprising:
a casing having an opening, the opening having a top side;
a circuit board;
a connector comprising a terminal housing and a shell;
an electronic card tray, the electronic card tray comprising a first side and a second side, an electronic card receiving recess, a mounting block positioned in front of the electronic card receiving recess and an operating handle pivotally connected to the mounting block;
a switch, the switch having an insulative body, the switch further having a movable member, the movable member includes a clamp portion, the switch further having a fixed member, the fixed member is partially embedded in the insulative body and the insulative body is clamped on the clamp portion and electrically isolates the movable member and the fixed member, and
wherein the switch is positioned alongside a rotation range of the operating handle, and partially protruding into the rotation range allowing the rotation of the operating handle to change the state of the switch and the switch being provided on the circuit board, the electronic card tray is inserted into the connector via the opening.

2. The electronic device according to claim 1, wherein the electronic card tray can be inserted into the connector with either side of the electronic card tray facing the top side of the opening.

3. The electronic device according to claim 1, wherein a front end surface of the operating handle and a surface on the casing surface near the opening are continuous.

4. The electronic device according the claim 1, wherein the switch comprises a movable member, a fixed member and an insulative body, the movable member comprises a claim portion, the fixed member is partially embedded in the insulative body and the insulative body is clamped on the clamp portion and electrically isolates the movable member and the fixed member.

5. The electronic device according to claim 1, wherein the electronic card connection device includes two switches and one of the two switches is positioned in front of the connector, and the other one of the two switches is positioned in front of and alongside the connector.

* * * * *